US008457499B2

(12) United States Patent
Hamana et al.

(10) Patent No.: US 8,457,499 B2
(45) Date of Patent: Jun. 4, 2013

(54) SEMICONDUCTOR LASER DRIVE DEVICE, SEMICONDUCTOR LASER DRIVE METHOD, LIGHT TRANSMISSION DEVICE, OPTICAL WIRING MODULE, AND ELECTRONIC DEVICE

(75) Inventors: Kentaro Hamana, Nara (JP); Akira Enami, Ashiya (JP); Yukari Terakawa, Kyoto (JP); Keisuke Uno, Ikoma (JP); Hayami Hosokawa, Kyoto (JP)

(73) Assignee: OMRON Corporation, Kyoto (JP)

( * ) Notice: Subject to any disclaimer, the term of this patent is extended or adjusted under 35 U.S.C. 154(b) by 653 days.

(21) Appl. No.: 12/672,763

(22) PCT Filed: Aug. 8, 2008

(86) PCT No.: PCT/JP2008/064315
§ 371 (c)(1),
(2), (4) Date: Feb. 9, 2010

(87) PCT Pub. No.: WO2009/022651
PCT Pub. Date: Feb. 19, 2009

(65) Prior Publication Data
US 2012/0134681 A1    May 31, 2012

(30) Foreign Application Priority Data

Aug. 13, 2007  (JP) ................................ 2007-210807

(51) Int. Cl.
*H04B 10/12* (2006.01)
*H01S 3/13* (2006.01)
*H01S 3/00* (2006.01)

(52) U.S. Cl.
USPC .............. 398/141; 372/32; 372/33; 372/38.1; 372/38.01

(58) Field of Classification Search
USPC ................... 398/141; 372/32, 33, 38.1, 38.01
See application file for complete search history.

(56) References Cited

U.S. PATENT DOCUMENTS 5,978,395 A  * 11/1999  Nomura ........................... 372/34
6,195,370 B1 *  2/2001  Haneda et al. .............. 372/29.01

(Continued)

FOREIGN PATENT DOCUMENTS

JP    3-133187 A    6/1991
JP    5-190947 A    7/1993

(Continued)

OTHER PUBLICATIONS

Chinese Office Action issued in Chinese Application No. 20080102615.8 dated Apr. 8, 2011 and English translation 9 pages.

(Continued)

*Primary Examiner* — Kenneth N Vanderpuye
*Assistant Examiner* — Amritbir Sandhu
(74) *Attorney, Agent, or Firm* — Osha Liang LLP

(57) ABSTRACT

A semiconductor laser drive apparatus comprises a bias current setting section (232) which sets a bias current value on the basis of the drive temperature so that the temperature characteristic of the bias current value with respect to the drive temperature may be a linear function having a slope except zero and a drive current setting section (233) for setting the drive current value on the basis of the drive temperature so that the temperature characteristic of the drive current value with respect to the drive temperature may be a function having a slope except zero. The temperature characteristic of the bias current and that of the drive current are functions different from each other. With this, low cost, space-saving, and power-saving of a semiconductor laser are achieved, and a semiconductor laser drive apparatus enabling a good transmission characteristic on the reception side and a high optical output over the whole drive temperature range when driving the semiconductor laser can be provided.

25 Claims, 17 Drawing Sheets

U.S. PATENT DOCUMENTS

| | | | | |
|---|---|---|---|---|
| 6,501,773 | B1* | 12/2002 | Volz et al. | 372/29.02 |
| 7,018,114 | B2* | 3/2006 | Stewart | 385/92 |
| 7,269,192 | B2* | 9/2007 | Hayashi | 372/34 |
| 7,292,612 | B2* | 11/2007 | Ono | 372/38.02 |
| 2002/0105983 | A1* | 8/2002 | Nomura | 372/38.02 |
| 2003/0231665 | A1* | 12/2003 | Ichino | 372/32 |
| 2004/0057478 | A1* | 3/2004 | Saito | 372/33 |
| 2004/0208208 | A1* | 10/2004 | Shin et al. | 372/32 |
| 2005/0121632 | A1* | 6/2005 | Chieng et al. | 250/559.1 |
| 2005/0286575 | A1* | 12/2005 | Hattori | 372/29.2 |
| 2006/0285563 | A1* | 12/2006 | Hakomori | 372/38.01 |
| 2006/0291510 | A1* | 12/2006 | Juluri | 372/29.021 |
| 2007/0081567 | A1 | 4/2007 | Lam et al. | |
| 2007/0253454 | A1* | 11/2007 | Gustavson et al. | 372/38.07 |
| 2007/0280702 | A1* | 12/2007 | Kijima et al. | 398/192 |
| 2008/0002747 | A1* | 1/2008 | Ono | 372/38.02 |
| 2008/0247429 | A1* | 10/2008 | Colbourne | 372/26 |
| 2008/0273561 | A1* | 11/2008 | Fu et al. | 372/34 |
| 2008/0278565 | A1* | 11/2008 | Marsh et al. | 347/237 |
| 2009/0190617 | A1* | 7/2009 | Kikuchi | 372/29.021 |
| 2010/0172383 | A1* | 7/2010 | Montalvo et al. | 372/38.01 |
| 2011/0102537 | A1* | 5/2011 | Griffin et al. | 347/237 |
| 2012/0134380 | A1* | 5/2012 | Edamura et al. | 372/45.012 |
| 2012/0134681 | A1* | 5/2012 | Hamana et al. | 398/141 |
| 2012/0263202 | A1* | 10/2012 | Steinle et al. | 372/38.02 |

FOREIGN PATENT DOCUMENTS

| | | |
|---|---|---|
| JP | 10-209538 A | 8/1998 |
| JP | 10-284791 A | 10/1998 |
| JP | 11-135871 A | 5/1999 |
| JP | 2004-111827 A | 4/2004 |

OTHER PUBLICATIONS

International Search Report issued in PCT/JP2008/064315, mailed on Oct. 21, 2008, with translation, 6 pages.

Written Opinion issued in PCT/JP2008/064315, mailed on Oct. 21, 2008, 4 pages.

* cited by examiner

SEMICONDUCTOR LASER DRIVE DEVICE, SEMICONDUCTOR LASER DRIVE METHOD, LIGHT TRANSMISSION DEVICE, OPTICAL WIRING MODULE, AND ELECTRONIC DEVICE

TECHNICAL FIELD

The present invention relates to a semiconductor laser drive device used as a light source when performing data communication by transmission of optical signals between circuit substrates in an information transmission device including a portable telephone.

BACKGROUND ART

Currently, an optical communication network enabling large capacity data communication at high speed such as optical communication, optical network, and optical interconnection is expanding. When performing the data communication between substrates in an electronic device with the optical communication network, the communication is performed through the following method.

Specifically, a plurality of substrates in the electronic device is connected by an optical wiring module. The data communication is performed among the substrates by transmitting the optical signal of 1 GHz through the optical wiring module among the plurality of substrates.

In recent years, a method of using a surface emitting semiconductor laser for a light source when forming the optical communication network through such a method is given attention.

The surface emitting semiconductor laser is called a VCSEL (Vertical Cavity Surface Emitting Laser), and is a laser beam emitted perpendicular to the semiconductor wafer. The surface emitting semiconductor laser can obtain high optical output by low power consumption and easily create a one-dimensional array or a two-dimensional array compared to an end face emitting type (laser beam emitted parallel to the semiconductor wafer) that has been conventionally used, and hence has various advantages such as applicability to the multi-channel optical communication network are obtained. Thus, the surface emitting semiconductor laser is expected to be suitably used as an optical fiber, optical LAN (Local Area Network), multi-channel optical interconnection, and two-dimensional parallel light calculation light source.

As described above, the optical communication network can be applied to various types of fields, and is used under various conditions. Thus, the surface emitting semiconductor laser is desired to be satisfactorily driven under any condition. To this end, improvement of the surface emitting semiconductor laser itself is obviously necessary, but at the same time, a method of driving the surface emitting semiconductor laser also needs to be sufficiently considered.

The method of driving a general surface emitting semiconductor laser will now be briefly described with reference to FIGS. 21(a) and 21(b).

FIG. 21(a) is a view showing a relationship between the power of output light of a surface emitting semiconductor laser on a transmission side and a current value.

As shown in FIG. 21(a), the surface emitting semiconductor laser starts an oscillation operation when exceeding a threshold current. When starting the oscillation operation, the surface emitting semiconductor laser performs direct modulation using a bias current (a current smaller than or equal to a current value necessary for outputting a signal of "0") and a drive current produced when modulating the optical signal at the time of the oscillation (a modulation current and a current greater than or equal to the current value necessary for outputting the signal of "0" and smaller than or equal to the current value necessary for outputting a signal of "1"). In other words, a binary signal of "1" and "0" is generated by switching the bias current and the drive current. The binary signal generated by the direct modulation is transmitted to a reception side.

FIG. 21(b) is a view showing transmission characteristics of the surface emitting semiconductor laser on the reception side.

Specifically, FIG. 21(b) shows a so-called "eye pattern", or a state of rise and fall of the binary signal. The eye pattern is a diagram in which reception characteristics in a case where the reception side receives the signal of "0" and reception characteristics in a case where the reception side receives the signal of "1" are overlapped. As shown in FIG. 21(b), when an opening rate of the eye pattern is relatively large, the time (oscillation delay time) until outputting an electrical signal as an optical signal is short on the transmission side, and thus it can be said that a satisfactory transmission characteristic can be obtained on the reception side. On the contrary, when the oscillation delay time becomes long, the opening rate of the eye pattern becomes small. This means that the signal quality is disturbed on the reception side. The opening rate of the eye pattern refers to the portion surrounded as if an eye by two waveforms showing the reception characteristics when the reception side receives the signal of "0" and the reception characteristics when the reception side receives the signal of "1" in the eye pattern, and a rough specification of each standard is defined by a hexagonal pattern (called eye mask).

In the surface emitting semiconductor laser, the relationship between the bias current and the threshold current greatly influences dynamic characteristics. Normally, the extinction ratio (ratio of power of output light in ON state and power of output light in OFF state) of the output light serving as the optical signal becomes smaller and the characteristics degrade as the bias current becomes larger than the threshold current. On the contrary, the oscillation delay time becomes longer the smaller the bias current compared to the threshold current. That is, the transmission characteristics on the reception side are disturbed and drawbacks occur in the data communication.

In addition, the threshold current has a very strong dependency with respect to temperature, and the threshold current greatly differs depending on the temperature (drive temperature) for driving the surface emitting semiconductor laser even when the same output light power is obtained.

Therefore, in order to satisfactorily drive the surface emitting semiconductor laser regardless of the change in the drive temperature, the relationship of the bias current, the threshold current, and the drive current needs to be sufficiently and appropriately set.

A known example of the drive method that takes into consideration the relationship between the bias current, the threshold current, and the drive current will be briefly described, where two methods will be described.

In the first method, the bias current holds the current value constant by the APC (Automatic Power Circuit) circuit, as in the invention disclosed in Patent Document 1. The temperature characteristics of the drive current are represented by synthesizing a plurality of linear characteristics, and the characteristics of the drive current itself are approximated by exp function. In the second method, one or both of the bias current and the drive current are driven by two current sources, as in the invention disclosed in Patent Document 2. The temperature characteristics and the current characteristics are approximated by the exp function. Through such methods, the threshold current and the slope efficiency (slope of the fluctuation of the power of the output light with respect to the fluctuation of the current value when the current value is raised from the bias current to the drive current) can be expressed with the exp function. The power of the output light becomes constant irrespective of the change in the drive temperature by controlling the current values in correspondence to the drive temperature.

However, the inventions disclosed in Patent Documents 1 and 2 have a problem in that application cannot be made when having the temperature characteristics in which the threshold current cannot be approximated with the exp function. Furthermore, when the temperature characteristics of the threshold current and the temperature characteristics of the slope efficiency greatly differ, the power of the output light may become more unstable.

As a method of solving the above problem, Patent Document 3 discloses an invention of a method of driving the semiconductor laser in an aim of reducing the drive current while ensuring a desired value for the extinction ratio and the oscillation delay time.

In the invention disclosed in Patent Document 3, the following conditions [A] to [C] are further set.

Condition [A]: Maintain the temperature to lower than or equal to a predetermined value in drive range (drive temperature range)

Condition [B]: Have extinction ratio constant at a lower limit of drive temperature range Condition [C]: Have oscillation delay time constant at an upper limit of drive temperature range Specifically, mathematical formula (A) defining an upper limit of an active layer temperature determined by a condition such as reliability of a laser is set for condition [A]:

$$Toh+\Delta T(Id)<TH \quad (A)$$

The mathematical formula (B) defining the condition of constant extinction ratio at the lower limit temperature in the drive temperature range is set for condition [B]:

$$[Ib+Id-Ith(TL)]/[Ib-Ith(TL)] \geq R \quad (B)$$

and

The mathematical formula (C) defining the condition of constant oscillation delay time at the upper limit temperature in the drive temperature range is set for condition [C]:

$$Td \leq T0 \quad (C)$$

(Where Toh: upper limit of ambient temperature; $\Delta T(Id)$: temperature rise of active layer caused by flowing drive current Id to semiconductor laser, TH: upper limit to be satisfied by temperature of active layer determined by conditions such as reliability, R: desired extinction ratio, Ib: bias current, Id: drive current, Ith(TL): threshold current at lower limit temperature of applicable temperature range, Td: oscillation delay time, T0: desired oscillation delay time).

The current values of the bias current and the drive current are fixed to current values that satisfy all of the above conditions [A] to [C].

Through such a drive method, in Patent Document 3, the drive current is reduced while ensuring the value desired by the optical communication network with respect to the extinction ratio and the oscillation delay time, and the power of the output light is made constant.

Patent Document 1: Japanese Unexamined Patent Publication No. 3-133187 (date of publication: Jun. 6, 1991)

Patent Document 2: Japanese Unexamined Patent Publication No. 10-209538 (date of publication: Aug. 7, 1998)

Patent Document 3: Japanese Unexamined Patent Publication No. 5-190947 (date of publication: Jul. 30, 1993)

DISCLOSURE OF THE INVENTION

However, the technique disclosed in Patent Document 3 has a problem in that reducing the power consumption is difficult.

In other words, in Patent Document 3, the region of the current values of the bias current and the drive current is set by conditions [A] to [C] necessary for ensuring the desired extinction ratio and sufficiently reducing the oscillation delay time. The drive current value and the bias current value are respectively fixed at the minimum drive current value in the region and the bias current value when such a drive current is obtained.

If the drive temperature is high temperature, the bias current is lower than the threshold current. If the bias current is lower than the threshold current, oscillation delay occurs when performing a high speed transmission of 1 Gbps order, the laser drive itself becomes impossible, and transmission may not be carried out.

The bias current needs to be made large in order to prevent such drawbacks, but the extinction ratio becomes small if the bias current is made large. Thus, the minimum required drive current becomes extremely large to ensure the extinction ratio when the drive temperature is low temperature, resulting in a problem that the power consumption greatly increases.

The countermeasure method for the problem that occurs between the drive temperature and the bias current includes a method of adding an APC circuit or an ATC (Automatic Temperature Control) circuit. However, the APC circuit and the ATC circuit have complicating circuit configurations and a relatively large circuit scale, and thus the power consumption, the scale of the entire device and the like all increase if such circuits are added. Introduction to the information transmission device for general consumers including the portable telephone is thus inappropriate.

One or more embodiments of the present invention provide a semiconductor laser drive device enabling lower cost, space saving, and lower power of the semiconductor laser, and obtaining satisfactory transmission characteristics and light output on the reception side over the entire drive temperature range in the drive of the semiconductor laser.

In one or more embodiments of the present invention, a semiconductor laser drive device includes: drive means for outputting an optical signal from a semiconductor laser by applying a bias current, or the bias current and a drive current to the semiconductor laser based on a modulating signal; and output adjustment means for controlling a bias current value and a drive current value to apply to the drive means; wherein the output adjustment means includes bias current setting means for setting the bias current value so that temperature characteristics of the bias current value with respect to a drive temperature are a function having a slope other than zero based on the drive temperature of the semiconductor laser and drive current setting means for setting the drive current value so that temperature characteristics of the drive current value with respect to a drive temperature are a function having a slope other than zero based on the drive temperature; and wherein the temperature characteristics of the bias current value and the temperature characteristics of the drive current value are functions different from each other.

In one or more embodiments of the present invention, a semiconductor laser drive method includes a driving step of outputting an optical signal from a semiconductor laser by applying a bias current, or the bias current and a drive current to the semiconductor laser based on a modulating signal; and an output adjustment step of controlling a bias current value and a drive current value to apply in the driving step; wherein in the output adjustment step the bias current value is set so that temperature characteristics of the bias current value with respect to a drive temperature are a function having a slope other than zero based on the drive temperature of the semiconductor laser, and the drive current value is set so that temperature characteristics of the drive current value with respect to the drive temperature are a function having a slope other than zero based on the drive temperature; and the temperature characteristics of the bias current value and the temperature characteristics of the drive current value are functions different from each other.

According to the above configuration, the bias current value is set so that the temperature characteristics of the bias current value with respect to the drive temperature are a function having a slope other than zero based on the drive temperature of the semiconductor laser itself (drive temperature). Furthermore, according to the above configuration, the drive current value is set so that the temperature characteristics of the drive current value with respect to the drive temperature are a function having a slope other than zero based on the drive temperature.

In the case of the conventional configuration, the oscillation delay occurs when the drive temperature is a high temperature, and the extinction ratio lowers thereby increasing the power consumption when the temperature is a low temperature.

The semiconductor laser drive device according to the present invention, on the contrary, controls the bias current value so that the temperature characteristics of the bias current value with respect to the drive temperature are a linear function having a slope other than zero.

The semiconductor laser thus can be driven by the minimum requisite bias current value for driving the semiconductor laser with stable transmission characteristics. That is, if a large bias current is necessary, the risk of oscillation delay can be reduced by setting the bias current value large. If the bias current may be small, the power consumption can be reduced by setting the bias current value small.

Furthermore, the temperature characteristics of the bias current value and the temperature characteristics of the drive current value have different functions. The reason therefor will be described below.

In the semiconductor laser of end surface light emitting type used in the prior art, the temperature characteristics of the threshold current value are generally determined based on the same parameter (temperature characteristics of a maximum gain of the semiconductor laser) as the temperature characteristics of the slope efficiency, and thus the temperature characteristics of the threshold current and the slope efficiency are recognized to have substantially the same characteristics. Therefore, in the semiconductor laser of end face emitting type, the temperature characteristics of the bias current value and the temperature characteristics of the drive current value do not need to be different functions.

The surface emitting semiconductor laser suitably used in the present invention, on the other hand, have the temperature characteristics of the slope efficiency and the temperature characteristics of the threshold current value determined based on parameters different from each other.

Specifically, the temperature characteristics of the slope efficiency are determined based on the temperature characteristics of the maximum gain of the surface emitting semiconductor laser, similar to the semiconductor laser of end face emitting type. The temperature characteristics of the threshold current are determined based on the temperature characteristics of the maximum gain of the surface emitting semiconductor laser and the temperature characteristics of the gain spectrum. The temperature characteristics of the threshold current are thus often a curve projecting downward in a graph in which the vertical axis is the threshold current value and the horizontal axis is the drive temperature (i.e., temperature characteristics of the threshold current have an extreme value).

Thus, the temperature characteristics of the threshold current value have temperature characteristics different from the temperature characteristics of the slope efficiency. When the temperature characteristics of the threshold current and the temperature characteristics of the slope efficiency differ, the fluctuation in power of the output light of the surface emitting semiconductor laser caused by change in drive temperature is often suppressed by having the bias current value and the drive current value as functions different from each other.

Therefore, it is important that the temperature characteristics of the bias current and the temperature characteristics of the drive current are functions different from each other. In the semiconductor laser drive device according to the present invention, the bias current value and the drive current value can be independently determined by using the drive means and the output adjustment means. In other words, in the semiconductor laser drive device according to the present invention, the bias current value and the drive current value can be set to different functions by using the drive means and the output adjustment means.

Therefore, lower cost, space saving, and lower power of the semiconductor laser can be realized, and satisfactory transmission characteristics and light output can be obtained on the reception side over the entire drive temperature range in the drive of the semiconductor laser.

In the semiconductor laser drive device according to the present invention, wherein the bias current setting means of the output adjustment means may set the bias current value so that the temperature characteristics of the bias current value are a linear function having a slope other than zero. In the semiconductor laser drive device according to the present invention, the bias current setting means of the output adjustment means may set the bias current value so that the temperature characteristics of the bias current value are a function including at least a first linear function that linearly changes from a lower limit temperature within a drive temperature range to a predetermined temperature within the drive temperature range, and a second linear function that linearly changes from the predetermined temperature to an upper limit temperature within the drive temperature range and that has a slope different from the first linear function.

According to the above configuration, the bias current setting means can set the temperature characteristics of the bias current value by one linear function or a combination of a plurality of linear functions. Thus, the bias current setting means can be configured by a simple circuit using a resistor and the like, and the characteristics can be set by appropriately changing the set value of the resistor.

That is, in the semiconductor laser drive method according to the present invention, the bias current value does not need to be controlled using the APC circuit, the ATC circuit and the like. The complication of the circuit configuration and the increase in the circuit scale thus can be suppressed. Therefore, the semiconductor laser drive method according to the present invention can suppress increase in the power consumption, the cost, and the scale of the entire device.

When the bias current value is set such that the temperature characteristics of the bias current value are a function including the first linear function and the second linear function (i.e., combination of a plurality of linear functions), the power consumption can be further reduced by appropriately setting the slopes of the plurality of linear functions. For example, if the temperature characteristics of the bias current are the temperature characteristics in which the bias current values at the upper limit and the lower limit within the drive temperature range are the same as a predetermined linear function (here, predetermined linear function is a function that is linear over the entire range of the drive temperature range) and including the first linear function and the second linear function in which the slope of the first linear function is smaller than the second linear function, the power consumption caused by the bias current can be reduced than the predetermined linear function.

The semiconductor laser drive device according to the present invention can be appropriately used as the semiconductor laser having the temperature characteristics of a threshold current value with respect to own drive temperature of a curve projecting downward in a graph in which a vertical axis is the threshold current value and a horizontal axis is the drive temperature. The extreme value of the temperature characteristics of the threshold current value with respect to the drive temperature of the semiconductor laser can be arbitrarily set by the epitaxial structure and the resonator length of the semiconductor laser.

In the semiconductor laser drive device according to the present invention, the drive current setting means of the output adjustment means sets the drive current value so that the temperature characteristics of the drive current value are a linear function having a slope other than zero.

A configuration of arbitrarily changing the drive current value non-linearly with respect to the drive temperature and arbitrarily changing the drive current value irrespective of the drive temperature includes use of the APC circuit. This type of circuit has a complicating circuit configuration and a relatively large circuit scale, as described above. Thus, when this type of circuit is used, the power consumption, the cost, and the scale of the entire device all increase, which is not suitable.

The drive current setting means desirably has a configuration of setting the drive current value so that the temperature characteristics of the drive current value are a linear function with respect to the drive temperature. According to such a configuration, the drive current setting means can be realized with a very simple circuit using a resistor and the like, whereby increase in the power consumption, the cost, and the scale of the entire device can be suppressed.

In the semiconductor laser drive device according to the present invention, the bias current setting means of the output adjustment means sets the temperature characteristics $Ib(T)$ of the bias current value to $Ib(T)=rb\cdot(T-Tr)+Ib(Tr)$, and sets slope rb of temperature characteristics of bias current value to $rb=[Ith(Th)-Ith(Tl)\pm\gamma]/\Delta T$. Here, T is a drive temperature, Tr is a normal temperature, $Ib(Tr)$ is a bias current at the normal temperature Tr, $Ith(Th)$ is a threshold current value of the semiconductor laser at a upper limit temperature Th within the drive temperature range, $Ith(Tl)$ is a threshold current value of the semiconductor laser at a lower limit temperature Tl within the drive temperature range, $\Delta T$ is a drive temperature range (i.e., Th−Tl), and $\gamma$ is a predetermined bias current value, or set to $Ith(Th)-Ith(Tl)\pm\gamma\neq0$.

According to the above configuration, the output adjustment means of the semiconductor laser drive device according to the present invention sets the temperature characteristics $Ib(T)$ of the bias current value and the slope rb of the temperature characteristics of the bias current value to values satisfying the above mathematical formulas by the bias current setting means. Thus, the bias current value is a magnitude of an extent drawbacks in the data communication caused by oscillation delay does not arise at the upper limit and the lower limit of the drive temperature range. The surface emitting semiconductor laser often has an extreme value in the temperature characteristics of the threshold current value. Thus, the temperature at which the threshold current becomes a maximum within the drive temperature range is the upper limit temperature Th within the drive temperature range or the lower limit temperature Tl within the drive temperature range. Thus, the output adjustment means of the semiconductor laser drive device according to the present invention sets the temperature characteristics $Ib(T)$ of the bias current value and the slope rb of the temperature characteristics of the bias current value to values satisfying the mathematical formulas. Thus, the possibility the drawbacks in the data communication caused by the oscillation delay arise can be reduced and the power consumption at the time of semiconductor laser drive can be reduced over the entire range of the drive temperature range.

In the semiconductor laser drive device according to the present invention, the drive current setting means of the output adjustment means has the temperature characteristics of the drive current value as a function substantially inversely proportional to a slope efficiency serving as a slope of fluctuation in power of output light from the semiconductor laser with respect to fluctuation in a current value when the current value of the semiconductor laser is raised from the bias current to the drive current, or an approximate line in which the function is approximated. In the semiconductor laser drive device according to the present invention, the semiconductor laser outputs the optical signal with respect to a light reception device including a light receiving element for receiving the optical signal; and the drive current setting means of the output adjustment means has the temperature characteristics of the drive current value as a function substantially inversely proportional with respect to a light receiving quantity in the light receiving element when the current value of the semiconductor laser is raised from the bias current to the drive current, or an approximate line in which the function is approximated.

According to the above configuration, if the temperature characteristics $Ib(T)$ of the bias current value satisfy the above condition, the fluctuation in the power of the output light of the semiconductor laser can be suppressed when the temperature characteristics of the drive current value have characteristics indicated by the above function or an approximate line in which the function is approximated.

In the semiconductor laser drive device according to the present invention, the semiconductor laser outputs the optical signal as a binary signal including "1" and "0" with respect to a light reception device including a light receiving element for receiving the optical signal and a reception side integrated circuit for amplifying the optical signal received by the light receiving element; and the output adjustment means sets the bias current value and the drive current value in a case where the drive temperature is a normal temperature to values satisfying, a first condition in which a extinction ratio, which is a ratio of the power of the output light when outputting the signal of "1" and the power of the output light when outputting the signal of "0", at the drive temperature the power of the output light from the semiconductor laser becomes a minimum within the drive temperature range is a value greater than or equal to a predetermined value, a second condition in which the bias current value is greater than or equal to a threshold current value of the semiconductor laser in a predetermined region within the drive temperature range, and a third condition in which the light receiving quantity of the optical signal at the light receiving element of the light reception device is greater than or equal to a minimum light receiving sensitivity serving as minimum power of an incident light that can be received of the reception side integrated circuit of the light reception device over an entire range within the drive temperature range.

According to the above configuration, the semiconductor laser drive device according to the present invention is arranged in the semiconductor laser for outputting an optical signal as a binary signal including "1" and "0" to the light reception device including a light receiving element for receiving the optical signal and a reception side integrated circuit for amplifying the optical signal received by the light receiving element. The output adjustment device of the semiconductor laser drive device according to the present invention defines the first to the third conditions, and sets the bias current value and the drive current value to values satisfying the first to the third conditions.

In the case of the conventional configuration, the bias current value and the drive current value are set to values at which the extinction ratio becomes greater than or equal to a predetermined value over the entire drive temperature range. Thus, if the temperature characteristics of the threshold current have an extreme value, the bias current value and/or the drive current value becomes uselessly large near the normal temperature at which the power of the output light is large, whereby the power consumption increases.

The output adjustment means of the semiconductor laser drive device according to the present invention, on the contrary, sets the bias current value and the drive current value to ensure the extinction ratio at which the output light can be received by the light reception device at the drive temperature the power of the output light becomes a minimum. If the extinction ratio at which the output light can be received by the light reception device is ensured at the drive temperature the power of the output light becomes a minimum, the extinction ratio at which the output light can be received can be obviously ensured over the entire range of the drive temperature range. If the extinction ratio becomes small, the minimum reception sensitivity of the reception side integrated circuit of the light reception device degrades and the light of weak power cannot be appropriately received, but the light reception device can appropriately receive even the light of weak power in the semiconductor laser drive device according to the present invention since the extinction ratio of an extent light can be received by the light reception device is ensured at the temperature the power of the output light of the semiconductor laser becomes a minimum.

Therefore, lower cost, space saving, and lower power of the semiconductor laser are realized, and satisfactory transmission characteristics and light output can be obtained on the reception side over the entire drive temperature range in the drive of the semiconductor laser. Furthermore, the bias current value and the drive current value can be further reduced near the normal temperature at which the extinction ratio is relatively large, whereby the power consumption can be further reduced.

In the semiconductor laser drive device according to the present invention, the bias current setting means and the drive current setting means of the output adjustment means determine a bias current value $Ib(Tw)$ and a drive current value $Im(Tw)$ at a drive temperature $Tw$ where the power of the output light from the semiconductor laser becomes a minimum within the drive temperature range that satisfies the first condition by $[Ib(Tw)+Im(Tw)-Ith(Tw)]/[Ib(Tw)-Ith(Tl)]$ $\geq E$, determine the bias current value $Ib(Tw)$ and the drive current value $Im(Tw)$ at the drive temperature $Tw$ where the power of the output light from the semiconductor laser becomes a minimum within the drive temperature range that satisfies the third condition by $Im(Tr) \geq -Ib(Tr)+(r2-r1)\cdot(Tw-Tr)+Ith(Tw)+(Pmin/\alpha\eta)$, and set the bias current value and the drive current value in the case where the drive temperature is the normal temperature to values further satisfying a fourth condition in which the upper limit of the bias current value and the upper limit of the drive current value defined by the characteristics of the transmission side integrated circuit incorporating the semiconductor laser are determined. Here, $Ith(Tw)$ is a threshold current value of the semiconductor laser at $Tw$, E is a minimum value of the extinction ratio in which the output light can be received by the light reception device, r2 is a slope of the temperature characteristics of the drive current value, r1 is a slope of the temperature characteristics of the bias current value, Pmin is a minimum light receiving sensitivity, $\alpha$ is a light loss in the path between the semiconductor laser and the light receiving element of the light reception device, and $\eta$ is a slope efficiency).

According to the above configuration, the semiconductor laser drive device according to the present invention sets the bias current value $Ib(Tw)$ and the drive current value $Im(Tw)$ at the drive temperature $Tw$ the power of the output light becomes a minimum within the drive temperature range to values satisfying the mathematical formula and satisfying the first to the third conditions by the bias current setting means and the drive current setting means of the output adjustment device. The output light can be received by the light reception device at the drive temperature $Tw$ the extinction ratio becomes a minimum in the drive temperature range, so that the power of the output light maintains the range (dynamic range) the output light can be received by the light reception device to the range of greater than or equal to the entire drive temperature range. The semiconductor laser thus can be drive without causing drawbacks in the data communication caused by the lowering of the extinction ratio over the entire range of the drive temperature range.

The upper limits of the bias current value and the drive current value that can be outputted by the transmission side integrated circuit exist in the transmission side integrated circuit incorporating the semiconductor laser. The upper limits of the bias current value and the drive current value determined by the transmission side integrated circuit are added to the setting condition as the fourth condition, that the set value of the bias current value when the drive temperature is the normal temperature can be more appropriately set.

In the semiconductor laser drive device according to the present invention, the output adjustment means controls the bias current value and the drive current value so that the drive temperature where the power of the output light from the semiconductor laser becomes a minimum within the drive temperature range matches the lower limit temperature or the upper limit temperature in the drive temperature range.

If the temperature characteristics of the threshold current value have an extreme value near the normal temperature, the temperature characteristics of the drive current value in which the extinction ratio is constant (e.g., predetermined extinction ratio E) are represented with a curve projecting upward with the vicinity of the normal temperature as a maximum value. Thus, the power of the output light lowers as the upper limit temperature or the lower limit temperature in the drive temperature range is approached. Thus, if the temperature characteristics of the threshold current value have an extreme value at the vicinity of the normal temperature, the drive temperature at which the power of the output light becomes a minimum is always either the upper limit temperature or the lower limit temperature Tl in the drive temperature range. In other words, the extinction ratio E at which the output light can be received by the light reception device is to be ensured at the temperature of the upper limit temperature or the lower limit temperature in the drive temperature range the power of the output light becomes smaller at the relevant temperature. At the vicinity of the normal temperature the extinction ratio becomes a minimum, the power of the output light becomes a maximum, and thus the reception of the output light by the light reception device is not influenced.

In the semiconductor laser drive device according to the present invention, the bias current setting means of the output adjustment means matches the bias current value with the threshold current value of the semiconductor laser at the lower limit temperature and the upper limit temperature in the drive temperature range.

According to the above configuration, the semiconductor laser drive device according to the present invention matches the threshold current value and the bias current value at the lower limit temperature in the drive temperature range, and matches the threshold current value and the bias current value at the upper limit temperature in the drive temperature range by the bias current setting means of the output adjustment means. In other words, the curve showing the temperature characteristics of the threshold current value and the line showing the temperature characteristics of the bias current value are intersected at the lower limit temperature and the upper limit temperature in the drive temperature range. The slope of the bias current in this case is the slope of the bias current capable of reducing the power consumption the most without causing drawbacks in the data communication originating from the oscillation delay and the lowering in the extinction ratio.

In the semiconductor laser drive device according to the present invention, the bias current setting means and the drive current setting means of the output adjustment means match the bias current value with the threshold current value of the semiconductor laser at the lower limit temperature and the upper limit temperature in the drive temperature range, and set the bias current value and the drive current value at the normal temperature to values satisfying relationships of: Im(Tr)=−Ib(Tr)+(r2−r1)·(Tw−Tr)+Ith(Tw)+(Pmin/αη) and Im(Tr)=Im(Tw)−r2(Tw−Tr).

According to the above configuration, the bias current value and the drive current value at the normal temperature are set to current values satisfying the function by the bias current setting means and the drive current setting means of the output adjustment means. The set values of the bias current value and the drive current value are set values of the bias current value and the drive current value capable of reducing the power consumption the most without causing drawbacks in the data communication originating from the oscillation delay and the lowering in the extinction ratio.

In the semiconductor laser drive device according to the present invention, the bias current setting means and the drive current setting means of the output adjustment means set the bias current value and the drive current value when the drive temperature is the normal temperature to values further satisfying the fourth condition in which the extinction ratio Er (Er<E) at the normal temperature is a value greater than or equal to a predetermined value. The extinction ratio Er at the normal temperature has a relationship of Er<E.

If the semiconductor laser is a type having a short resonator structure, the temperature characteristics of the drive current in which the extinction ratio is constant (e.g., predetermined extinction ratio E) are expressed with a curve projecting upward. In particular, if the extreme value of the temperature characteristics of the threshold current value exists at the vicinity of the normal temperature, the extinction ratio at the vicinity of the normal temperature is a relatively small value compared to the extinction ratio at other temperatures. Thus, the change in the extinction ratio caused by the change in drive temperature can be reduced by setting the extinction ratio at the vicinity of the normal temperature to a value greater than or equal to the predetermined extinction ratio Er as the fourth condition. The value of the extinction ratio thus stabilizes over the entire drive temperature range. Therefore, very stable transmission characteristics and light output are obtained on the reception side, In the semiconductor laser drive device according to the present invention, the bias current setting means and the drive current setting means of the output adjustment means set the bias current value and the drive current value when the drive temperature is the normal temperature to values further satisfying the fourth condition in which a fluctuation range of the power of the output light is a value smaller than or equal to a predetermined value over the entire range of the drive temperature range.

According to the above configuration, a condition that the fluctuation range of the power of the output light is a value smaller than or equal to a predetermined value in the entire range of the drive temperature range is defined as the fourth condition. The current values of the bias current and the drive current when the drive temperature is a normal temperature are set to values satisfying the first to fourth conditions. Therefore, the output fluctuation in the drive temperature range can be reduced. Therefore, the power of the output light can be suppressed to a range of the output fluctuation desired by the optical wiring module over the entire drive temperature range, and very stable transmission characteristics and light output can be obtained on the reception side.

In the semiconductor laser drive device according to the present invention, the temperature characteristics Ith(T) of the threshold current value of the semiconductor laser are expressed as mathematical formula (1) below. Here, Ith(Tr) is a threshold current value of the semiconductor laser at the normal temperature; $T_{01}$ is a characteristic temperature defining the fluctuation range of the gain spectrum of the semiconductor laser with respect to the drive temperature; $T_{02}$ is a characteristic temperature defining the reduction amount of the maximum gain of the semiconductor laser with respect to the drive temperature.

$$Ith(T) = Ith(Tr)\exp\left[\left(\frac{T-Tr}{T_{01}}\right)^2 + \left(\frac{T-Tr}{T_{02}}\right)\right] \quad (1)$$

According to the above configuration, the temperature characteristics of the threshold current value of the semiconductor laser can be expressed with the mathematical formula (1). The temperature characteristics of the threshold current value are a curve projecting downward with the vicinity of the normal temperature Tr as a minimum value by deriving the temperature characteristics of the threshold current value based on the mathematical formula (1). If the semiconductor laser is a semiconductor laser of a type having a short resonator structure, the temperature characteristics of the threshold current value often have an extreme value, and the minimum value thereof can be arbitrarily set by the epitaxial structure and the resonator length.

In the semiconductor laser drive device according to the present invention, the temperature characteristics Ith(T) of the threshold current value of the semiconductor laser are expressed as mathematical formula (2) below. Here, Ith(Tc) is a threshold current value of the semiconductor laser at temperature Tc; Tc is Tc<lower limit temperature Tl within drive temperature range or upper limit temperature Th within drive temperature range Tc).

$$Ith(T) = Ith(Tc)\exp\left[\left(\frac{T-Tc}{T_{01}}\right)^2 + \left(\frac{T-Tc}{T_{02}}\right)\right] \quad (2)$$

According to the above configuration, the drive temperature when the temperature characteristics of the threshold current value take an extreme value is not necessarily within the drive temperature range. For example, in the mathematical formula indicated by the mathematical formula (2), the drive temperature when the temperature characteristics of the threshold current value take an extreme value is set to a temperature lower than or equal to the drive temperature range. In this case, the temperature characteristics of the threshold current value are a curve projecting downward with the temperature of lower than or equal to the drive temperature range as a minimum value. The curve of the temperature characteristics of the threshold current value are a curve that monotonously increases within the drive temperature range and that is close to a straight line within the drive temperature range. The bias current thus can be proximated by the curve.

In the semiconductor laser drive device according to the present invention, a tolerable range of the slope rb of the temperature characteristics of the bias current value with respect to variation in the temperature characteristics of the threshold current value with respect to the drive temperature of the semiconductor laser is [Ith(Th)A−Ith(Tl)A]/ΔT≧rb≧ [Ith(Th)C−Ith(Tl)C/ΔT]−α. Here, Ith(Th)A is Ith(Th) in temperature characteristics of threshold current value of semiconductor laser in which value of Ith(Th)−Ith(Tl) is largest, Ith(Tl)A is Ith(Th) in temperature characteristics of threshold current value of semiconductor laser in which value of Ith (Th)−Ith(Tl) is largest, Ith(Th)C is Ith(Th) in temperature characteristics of threshold current value of semiconductor laser in which value of Ith(Th)−Ith(Tl) is smallest, Ith(Tl)C is Ith(Th) in temperature characteristics of threshold current value of semiconductor laser in which value of Ith(Th)−Ith (Tl) is smallest. Moreover, [Ith(Th)C−Ith(Tl)C/ΔT]−α≠0 is set.

If the value of the slope rb of the temperature characteristics of the bias current value is too small, the extinction ratio degrades and the power consumption increases at the lower limit temperature in the drive temperature range. If too large, the bias current value becomes greatly smaller than the threshold current at the lower limit in the drive temperature range, whereby the transmission characteristics on the light reception device side are disturbed by the oscillation delay and drawbacks occur in the data communication. The power consumption can be further reduced without causing drawbacks in the data communication arising from the oscillation delay by providing a tolerable range of the slope rb of the bias current as described above.

The light transmission device according to the present invention includes a semiconductor laser drive device similar to any of those described above, and a semiconductor laser, in which the temperature characteristics of the threshold current value with respect to the own drive temperature are a curve projecting downward, for outputting the optical signal when the bias current and the drive current inputted from the semiconductor laser drive device are inputted. In such a light transmission device, output adjustment means of the semiconductor laser drive device desirably includes two or more types of temperature characteristics of the bias current value; and the temperature characteristics of the bias current value are desirably varied according to variation in the temperature characteristics of the threshold current value of the semiconductor laser.

The optical wiring module according to the present invention has a configuration including the light transmission device, the light reception device for receiving the optical signal outputted by the light transmission device, and a light guide for performing data communication between the light transmission device and the light reception device by connecting the light transmission device and the light reception device. The light reception device may obviously include a light receiving element and a reception side integrated circuit.

The optical wiring module may also be arranged in an electronic device to perform data communication.

Lower cost, space saving, and lower power of the semiconductor laser are realized, and satisfactory transmission characteristics and light output are obtained on the reception side over the entire drive temperature range in the drive of the semiconductor laser.

As described above, the semiconductor laser drive device according to the present invention includes drive means for outputting an optical signal from the semiconductor laser by applying a bias current, or the bias current and a drive current to the semiconductor laser based on a modulating signal; and output adjustment means for controlling a bias current value and a drive current value to apply to the drive means; where the output adjustment means includes bias current setting means for setting the bias current value so that a temperature characteristics of the bias current with respect to the drive temperature are a function having a slope other than zero based on the drive temperature of the semiconductor laser, and drive current setting means t for setting the drive current value so that a temperature characteristics of the drive current with respect to a drive temperature are a function having a slope other than zero based on the drive temperature; and the temperature characteristics of the bias current value and the temperature characteristics of the drive current value are functions different from each other.

Therefore, lower cost, space saving, and lower power of the semiconductor laser are realized, and satisfactory transmission characteristics and light output are obtained on the reception side over the entire drive temperature range in the drive of the semiconductor laser.

DESCRIPTION OF SYMBOLS

Figure 1:
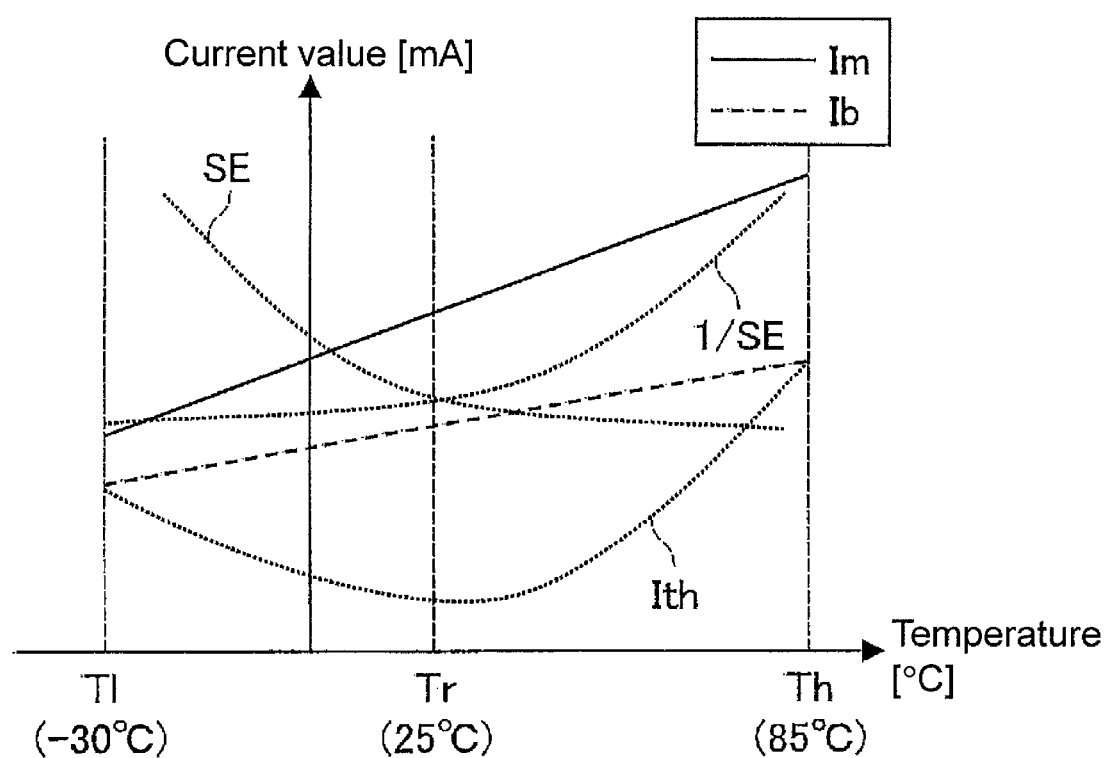
FIG. 1 is a graph showing an embodiment of the present invention, and showing a semiconductor laser drive method according to the present invention.

| | |
|---|---|
| 1 | optical wiring module |
| 2a to 2c | light transmission device |
| 3 | light reception device |
| 4 | light guide (transmission medium) |
| 22, 52 | light transmission device main body |
| 23, 53a, 53b | output adjustment circuit (output adjustment means) |
| 24, 54 | driver circuit (drive means) |
| 25 | light emitting element (semiconductor laser) |
| 30 | portable telephone (electronic device) |
| 40 | printer (electronic device) |
| 55 | surface emitting semiconductor laser (semiconductor laser) |
| 56 | light transmission medium (transmission medium) |
| 232, 532 | bias current setting part (bias current setting means) |
| 532a | low temperature bias current setting part |
| 532b | high temperature bias current setting part |
| 233, 533 | drive current setting part (drive current setting means) |
| 533a | low temperature drive current setting part |
| 533b | high temperature drive current setting part |

BEST MODE FOR CARRYING OUT THE INVENTION

Embodiments of the present invention will be described below with reference to FIGS. 1 to 20. The same reference numerals designate members having the same functions as the members already described with reference to the drawings, and their description will not be given for the sake of convenience of description.

First Embodiment

Figure 2:
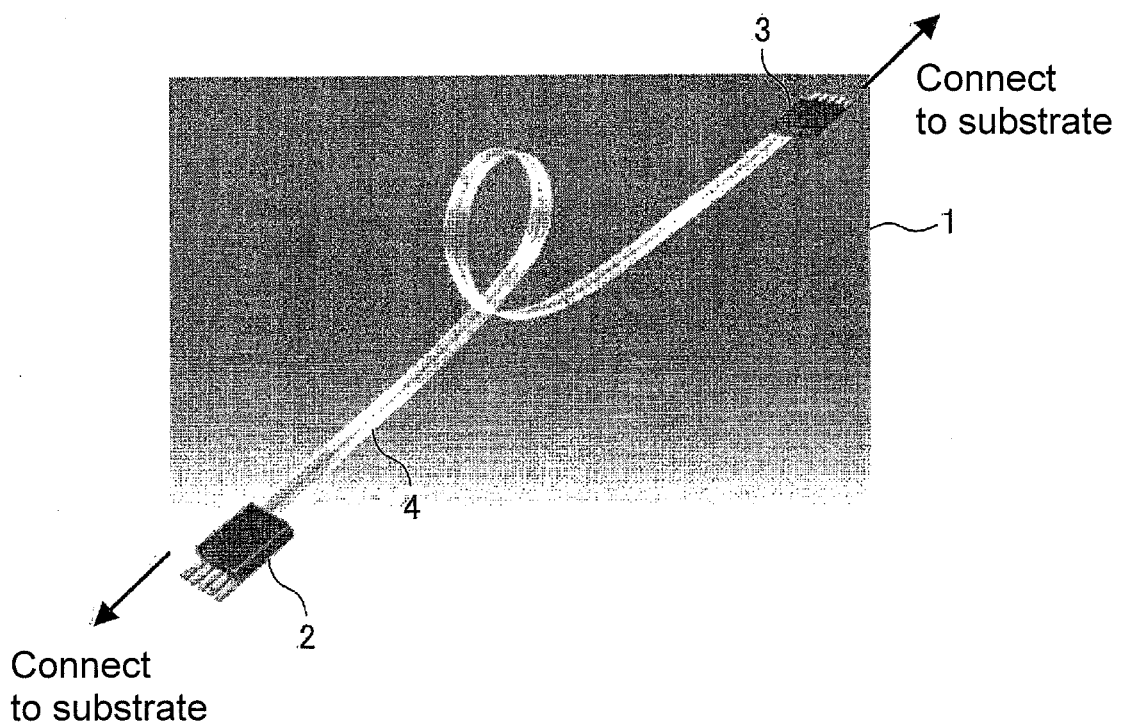
FIG. 2 is a view showing a schematic configuration of an optical wiring module.

FIG. 2 shows a schematic view of an optical wiring module.

The optical wiring module 1 shown in FIG. 2 includes a light transmission device 2, a light reception device 3, and a light guide (transmission medium) 4 having high bendability, and connects a liquid crystal drive circuit substrate and a signal processing circuit substrate in a portable telephone, and the like.

The light transmission device 2 includes a surface emitting semiconductor laser drive circuit (integrated circuit, drive means) and a surface emitting semiconductor laser (semiconductor laser). In the present embodiment and embodiments to be described later, the light transmission device 2 is assumed to include the surface emitting semiconductor laser for the semiconductor laser. The semiconductor laser of the light transmission device 2 is not limited to the surface emitting semiconductor laser. In other words, the semiconductor laser of the light transmission device 2 may be a semiconductor laser of an end face emitting type mentioned above.

The light reception device 3 includes a light receiving element and a light receiving IC. A photodiode, a CCD (Charge Coupled Devices), a CMOS (Complementary Metal Oxide Semiconductor) image sensor, and the like are elements that can be used for the light receiving element.

The light guide 4 is formed by a core having a large index of refraction and a clad having a small index of refraction arranged in contact with a periphery of the core, and is used to propagate an optical signal entered to the core by repeating total reflection at the boundary of the core and the clad. However, the configuration of the light guide 4 applied to the optical wiring module 1 is not limited to the above configuration, and a conventionally well known light guide can be used.

The operation of the optical wiring module 1 shown in FIG. 2 will be briefly described.

The light transmission device 2 directly modulates a laser beam from the surface emitting semiconductor laser with the surface emitting semiconductor laser drive circuit to output as a binary signal of "1" and "0".

The binary signal outputted from the light transmission device 2 is inputted to the light reception device 3 through the light guide 4.

The light reception device 3 receives the binary signal at the light receiving element, and amplifies the binary signal with the light receiving IC.

If the surface emitting semiconductor laser is used for the light source in the optical wiring module 1 of FIG. 2, it is important that transmission characteristics are satisfactory regardless of the change in drive temperature in the drive of the surface emitting semiconductor laser. To have a satisfactory transmission characteristics regardless of the change in drive temperature, it is important to drive the light transmission device 2 so as to satisfy the transmission characteristics desired by the light reception device 3 side over the entire drive temperature range of the surface emitting semiconductor laser. Here, a method of determining a bias current and a drive current, which is important in driving the light transmission device 2 in the above manner, will be described.

First, the circuit configuration necessary for implementing the semiconductor laser drive method according to the present invention will be described.

Figure 3:
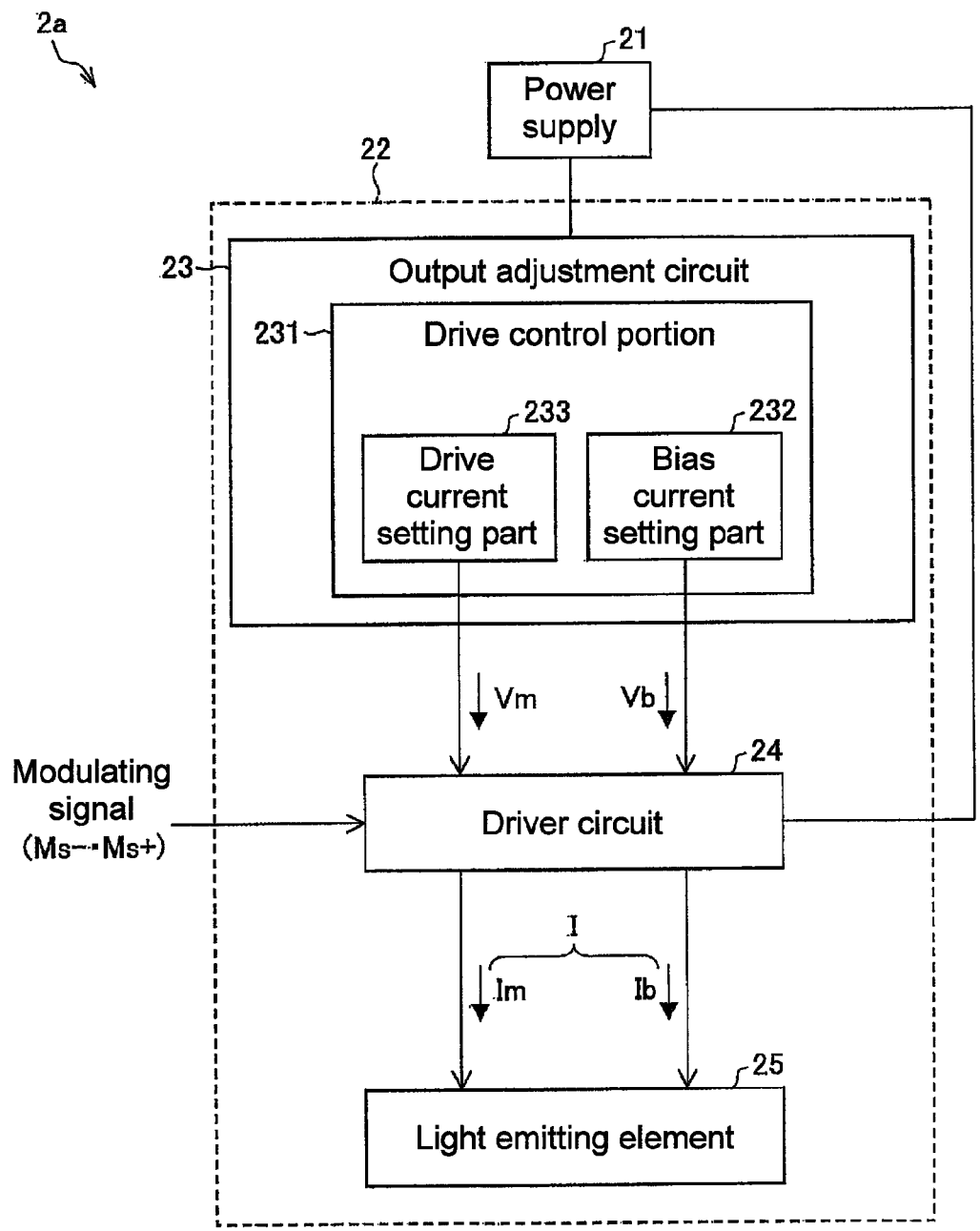
FIG. 3 is a diagram showing a circuit configuration of a light transmission device including a semiconductor laser drive device according to the present invention.

FIG. 3 is a diagram showing a circuit configuration of the light transmission device including the semiconductor laser drive device according to the present invention.

A light transmission device 2a shown in FIG. 3 includes a power supply 21 and a light transmission device main body 22. The light transmission device main body 22 includes an output adjustment circuit (output adjustment means) 23, a driver circuit (drive means) 24, and a light emitting element (semiconductor laser) 25.

The semiconductor laser drive device according to the present invention includes the output adjustment circuit 23 and the driver circuit 24.

The power supply 21 is a voltage source for driving the output adjustment circuit 23 and the driver circuit 24 by supplying a voltage Vcc to the output adjustment circuit 23 and the driver circuit 24.

The output adjustment circuit 23 is driven by the power supply 21, and changes the current values of the bias current and the drive current to be outputted by the driver circuit 24 according to the change in the drive temperature of the light transmission device 2a itself (drive temperature).

The output adjustment circuit 23 having a configuration of including a drive control portion 231 with a bias current setting part (bias current setting means) 232 and a drive current setting part (drive current setting means) 233 is considered.

The following operation principle can be considered for the operation principle of the output adjustment circuit 23.

When a control voltage corresponding to the drive temperature is applied to the bias current setting part 232, the bias current setting part 232 generates a signal Vb indicating the temperature characteristics of the desired bias current based on the control voltage, and outputs the signal Vb to the driver circuit 24. Similarly for the drive current setting part 233, the drive current setting part 233 applied with the control voltage generates a signal Vm indicating the temperature characteristics of the desired drive current based on the control voltage, and outputs the signal Vm to the driver circuit 24.

The characteristics of the signal Vb (or Vm) with respect to the control voltage of the bias current setting part 232 and the drive current setting part 233 can be arbitrarily determined by the drive temperature range, the temperature characteristics of the threshold current, the set values of the bias current and the drive current at normal temperature, and the like. Furthermore, the bias current setting part 232 and the drive current setting part 233 can be configured by a simple circuit using a resistor and the like, and the characteristics can be set by appropriately changing the set value of the resistor.

The detailed method of setting the current values of the bias current and the drive current will be described below.

The driver circuit 24 is driven by the power supply 21, and outputs the bias current and the drive current to the light emitting element 25. The driver circuit 24 receives the output signals Vb and Vm and the modulating signals Ms− and Ms+ from a modulating signal source (not shown). The driver circuit 24 generates the bias current Ib based on the output signal Vb and generates the drive current Im based on the output signal Vm. The bias current Ib and the drive current Im are switched by the modulating signals Ms− and Ms+ to perform direct modulation, the binary signal of "1" and "0" is generated, and the binary signal is outputted to the light emitting element 25.

The light emitting element 25 emits light in response to the binary signal from the driver circuit 24 to output an optical signal, and performs data communication with the light reception device 3 by transmitting the optical signal to the light reception device 3. The light emitting element 25 often has an extreme value in the temperature characteristics of the threshold current (however, the threshold current may present characteristics that do not have an extreme value depending on the usage condition of the surface emitting semiconductor laser). In the present embodiment and the subsequent embodiments, description will be made assuming that the light emitting element 25 has an extreme value in the temperature characteristics of the threshold current, but the light emitting element 25 does not necessarily need to have an extreme value in the temperature characteristics of the threshold current.

The light transmission device 2a can be similarly used in the subsequent embodiments. In order to obtain the output adjustment circuit 23 that is configured according to each embodiment, the characteristics of the output signals Vb and/or Vm with respect to the control voltage of the bias current setting part 232 and the drive current setting part 233 are appropriately set to the characteristics in which the current values of the bias current and the drive current corresponding to each embodiment are obtained, as described above.

Description will now be given of the detailed method of setting the temperature characteristics of the bias current and the drive current for realizing the semiconductor laser drive method using the semiconductor laser drive device according to the present invention.

FIG. 1 is a diagram showing a semiconductor laser drive method according to the present invention. Description will be made assuming that all the drive temperature range used in the present invention is between −30° C. and 85° C.

The semiconductor laser drive method according to the present invention shown in FIG. 1 satisfies the following conditions [1] to [5] (however, in the semiconductor laser drive method according to the present invention, conditions [1], [2], [4] do not necessarily need to be satisfied).

Condition [1]: Temperature characteristics (temperature characteristics of the threshold current) of the threshold current with respect to the drive temperature have an extreme value Condition [2]: Temperature characteristics (temperature characteristics of the bias current) of the bias current with respect to the drive temperature are a function (desirably, linear function) having a slope other than zero Condition [3]: Temperature characteristics of the bias current and the temperature characteristics (temperature characteristics of drive current) of the drive current with respect to the drive temperature have a slope different from each other Condition [4]: Temperature characteristics of the drive current are a function substantially inversely proportional to the slope efficiency or an approximate line thereof.

Condition [5]: Temperature characteristics of the bias current are a function complying with the temperature characteristics of the threshold current First, condition [1] specifically sets the threshold characteristics Ith(T) of the threshold current Ith to a value satisfying the following mathematical formula (1) as an approximate value of the threshold current.

$$Ith(T) = Ith(Tr)\exp\left[\left(\frac{T-Tr}{T_{01}}\right)^2 + \left(\frac{T-Tr}{T_{02}}\right)\right] \quad (1)$$

(where, Tr: normal temperature (e.g., 25° C.); Ith(Tr): current value of threshold current at normal temperature; $T_{01}$: characteristic temperature (parameter defining fluctuation range of gain spectrum of semiconductor laser with respect to drive temperature); $T_{02}$: characteristic temperature (parameter defining reduction amount of maximum gain of semiconductor laser with respect to drive temperature)).

As described above, the surface emitting semiconductor laser (i.e., light emitting element 25) often has an extreme value in the temperature characteristics of the threshold current, which extreme value can be arbitrarily set by an epitaxial structure and resonator length of the surface emitting semiconductor laser.

Figure 4:
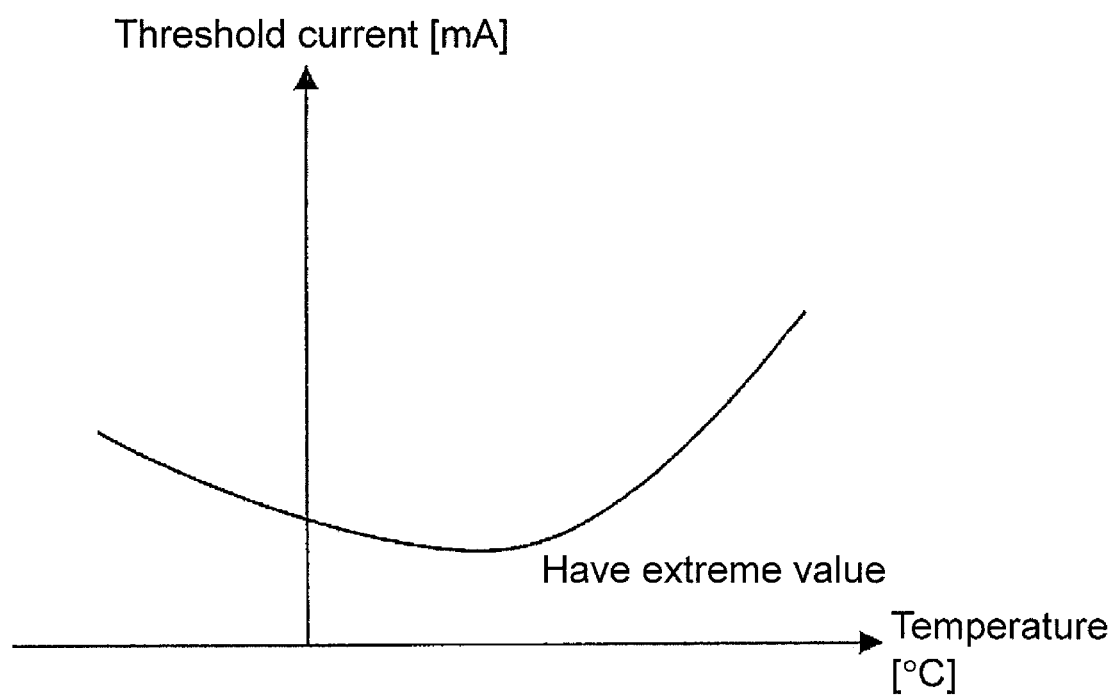
FIG. 4 is a graph showing temperature characteristics of a threshold current of a general surface emitting semiconductor laser.

According to the mathematical formula (1), the temperature characteristics of the threshold current become a curve projecting downward with the vicinity of the normal temperature as the minimum value, as shown in FIG. 4, and the current value of the threshold current becomes relatively high at both the high temperature side and the low temperature side of the drive temperature range.

Figure 5:
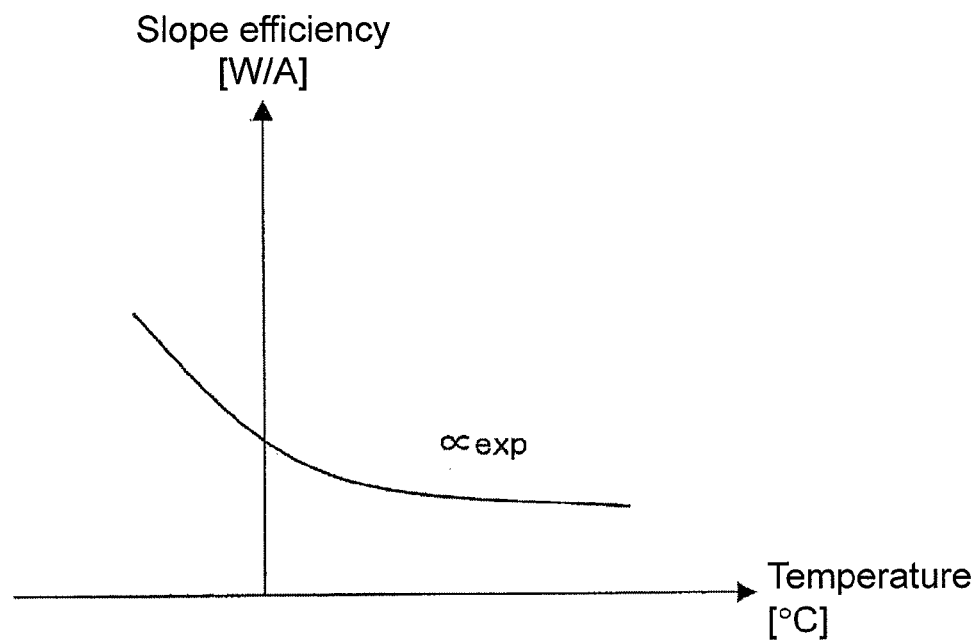
FIG. 5 is a graph showing the temperature characteristics of temperature characteristics of slope efficiency of the general surface emitting semiconductor laser.

The temperature characteristics of the slope efficiency in this case can be expressed with the exp function, as shown in FIG. 5. The temperature characteristics of the slope efficiency have substantially the same characteristics as the semiconductor laser of the end face emitting type.

When the threshold current becomes large, the power of the output light of the surface emitting semiconductor laser obtained at a specific bias current and drive current becomes small compared to when the threshold current is small. The power needs to be within the dynamic range even when the power of the output light of the surface emitting semiconductor laser lowers to accurately execute the data communication by the surface emitting semiconductor laser in this case. Thus, the output fluctuation of the power needs to be suppressed to a value smaller than or equal to a predetermined value (e.g., 3 dB).

Therefore, in view of the output fluctuation of the power, the temperature characteristics of the bias current and the drive current need to be determined to a magnitude of an extent normal communication can be executed at low power consumption.

The point to pay attention to here is that the temperature characteristics of the bias current change the current value with respect to the drive temperature (i.e., temperature characteristics of the bias current are a function having a slope other than zero), and desirably, the temperature characteristics of the bias current and the drive current are linear functions with respect to the drive temperature, as indicated in condition [2]. In the semiconductor laser drive method according to the present invention, the current values of the bias current and the drive current are linearly changed with respect to the temperature change using the output adjustment circuit 23.

A configuration of nonlinearly changing the current values of the bias current and the drive current with respect to the temperature change, that is, arbitrarily changing the current values of the bias current and the drive current regardless of the temperature change includes using the APC circuit. However, the APC circuit has a complicating circuit configuration and a relatively large circuit scale, as described above. Thus, it is not suitable to use the APC circuit since the power consumption, the cost, and the scale of the entire device all increase.

Therefore, the bias current and the drive current are controlled using the output adjustment circuit 23, and the temperature characteristics of the bias current and the drive current are set to linear functions with respect to the drive temperature herein.

The temperature characteristics of the bias current and the drive current do not necessarily need to be represented with a linear function, and are not particularly limited as long as they are a function having a slope other than zero (i.e., not constant current). A method of having the temperature characteristics of the bias current and the drive current as "function having a slope other than zero" without using the APC circuit and the like includes a method of combining a plurality of linear functions having different slopes from each other, as hereinafter described.

The temperature characteristics of the bias current and the temperature characteristics of the drive current are desirably a straight line having a slope different from each other, as indicated in condition [3].

The semiconductor laser of end face emitting type used in the prior art generally does not have an extreme value in the temperature characteristics of the threshold current. In this case, the temperature characteristics of the threshold current and the slope efficiency are determined based on the parameter same as each other (temperature characteristics of the maximum gain of the semiconductor laser that becomes a function proportional to exp ($-T/T_{02}$)), and thus the temperature characteristics of the threshold current and the slope efficiency are recognized to have substantially the same characteristics. Therefore, the temperature characteristics of the bias current and the temperature characteristics of the drive current do not need to have a slope different from each other.

The surface emitting semiconductor laser has the temperature characteristics of the slope efficiency and the temperature characteristics of the threshold current determined based on the parameters different from each other.

Specifically, the temperature characteristics of the slope efficiency are determined based on the temperature characteristics of the maximum gain of the surface emitting semiconductor laser. Thus, the temperature characteristics of the slope efficiency have the same characteristics as the semiconductor laser of end face emitting type described above. The temperature characteristics of the threshold current are determined based on the temperature characteristics of the maximum gain of the surface emitting semiconductor laser and the temperature characteristics of the gain spectrum. Thus, the temperature characteristics of the threshold current are often the characteristics having an extreme value (condition [1]).

Therefore, the temperature characteristics of the threshold current and the temperature characteristics of the slope efficiency often have characteristics different from each other. In order to have the temperature characteristics of the bias current and the drive current as characteristics that satisfy conditions [4] and [5], to be hereinafter described, the bias current and the drive current often need to be a straight line having a slope different from each other. Therefore, the temperature characteristics of the bias current and the temperature characteristics of the drive current are desirably straight lines having a slope different from each other, as indicated in condition [3].

In the light transmission device 2a, the current value of the bias current and the current value of the drive current are independently determined using the output adjustment circuit 23 and the driver circuit 24.

Therefore, the drive current and the bias current can have one current value arbitrarily changed without being influenced by the change in the other current value. If the temperature characteristics of the bias current need to be set as a function having the same slope as the temperature characteristics of the drive current as a result of determining the temperature characteristics of the bias current, as will be described later, the respective temperature characteristics may be a straight line having the same slope from each other.

In view of the output fluctuation of the power, the temperature characteristics of the drive current are desirably a function substantially inversely proportional to the slope efficiency or an approximate line approximating such a function, as indicated in condition [4]. In other words, the temperature characteristics of the drive current are desirably a function substantially inversely proportional to the light receiving quantity of the light receiving element 25 or an approximate line in which the function is approximated in the case where the current value is raised from the bias current to the drive current.

The temperature characteristics of the bias current are a function complying with the temperature characteristics of the threshold current, as indicated in condition [5]. Specifically, the temperature characteristics Ib(T) of the bias current Ib are set to a value satisfying mathematical formula (11)

$$Ib(T) = rb \cdot (T - Tr) + Ib(Tr) \tag{11}$$

(where T: drive temperature of surface emitting semiconductor laser (hereinafter referred to as the "drive temperature"), Tr: normal temperature, Ib(Tr): bias current at Tr).

The slope rb or the slope of the bias current Ib(T) is set as mathematical formula (12)

$$rb = [Ith(Th) - Ith(Tl)]/\Delta T \tag{12}$$

(where, Th: upper limit temperature in drive temperature range (i.e., 85°), Tl: lower limit temperature in drive temperature range (i.e., −30° C.), Ith(Th): threshold current at Th, Ith(Tl): threshold current at Tl, $\Delta T$: drive temperature region (Th−Tl). Furthermore, rb is a constant other than zero.)

If the bias current is considerably lower than the threshold current, the oscillation delay of a long time occurs and problems arise in the data communication. In the case of performing a high speed transmission of 1 Gbps order, such delay needs to be more or less completely suppressed. Thus, in the semiconductor laser drive method according to the present invention, the bias current is always followed to the threshold current over the entire drive temperature enrage, and the bias current is set to the above conditions.

The temperature characteristics of the drive current are set to the characteristics that satisfy condition [4], and the temperature characteristics of the bias current are set to the characteristics that satisfy condition [5], so that the fluctuation in the power of the output light of the surface emitting semiconductor laser caused by the change in drive temperature can be suppressed.

The effects obtained by satisfying conditions [4] and [5] will be described in detail below. The effects will be described using the power P (T+$\Delta T1$) of the output light of the surface emitting semiconductor laser when the drive temperature T is raised up to a specific drive temperature T+$\Delta T1$.

First, the power P of the output light of the surface emitting semiconductor laser is obtained by mathematical formula (13).

$$P = \eta (Im + Ib - Ith) \tag{13}$$

(where $\eta$: slope efficiency).

If the temperature characteristics of the drive current Im are expressed with the function substantially inversely proportional to the slope efficiency or the approximate line thereof by condition [4], the drive current Im(T+$\Delta T1$) at the drive temperature (T+$\Delta T1$) can be assumed as substantially equal to $Im \cdot \exp(-\Delta T1/T_{02})$.

The power P(T+$\Delta T1$) of the output light of the surface emitting semiconductor laser at the drive temperature T+$\Delta T$ is obtained by mathematical formula (14).

$$P(T+\Delta T1) = \eta \cdot \exp(\Delta T1/T_{02})\{Im \cdot \exp(-\Delta T1/T_{02}) + (Ib + \Delta 1Ib) - (Ith - \Delta 1Ith)\} = \eta \cdot Im + \eta \cdot \exp(\Delta T1/T_{02})\{(Ib - Ith) + (\Delta 1Ib - \Delta 1Ith)\} \tag{14}$$

(where $\Delta 1Ib$: increased amount of bias current when the drive temperature is raised from T to T+$\Delta T1$; $\Delta 1Ith$: increased amount of threshold current when the drive temperature is raised from T to T−$\Delta T1$). In other words, the fluctuation amount in the power of the output light of the surface semiconductor laser when the drive temperature is raised form T to T+$\Delta T1$ is as expressed in mathematical formula (15).

$$\eta \cdot \exp(\Delta T1/T_{02})\{(Ib - Ith) + (\Delta Ib1 - \Delta Ith1)\} \tag{15}$$

According to condition [5], the bias current Ib is a value following the threshold current Ith over the entire drive temperature range. In other words, the bias current Ib is substantially equal to the threshold current Ith.

The threshold current Ith, the bias current Ib, and the drive current Im have a relationship of mathematical formula (16), $$Im >> Ib - Ith \tag{16}$$

and the increased amount $\Delta Ib1$ of the bias current and the increased amount $\Delta Ith1$ of the threshold current when the drive temperature is raised from T to T+$\Delta T1$ are substantially equal.

Therefore, the fluctuation amount in the power of the output light of the surface emitting semiconductor laser when the drive temperature is raised from T to T+$\Delta T1$ is substantially zero. Therefore, the fluctuation in the power of the output light of the surface emitting semiconductor laser caused by the change in drive temperature can be suppressed.

In the conventional technique, when the temperature characteristics of the threshold current have an extreme value as in condition [1], the semiconductor laser is driven with the bias current as a fixed value. Thus, the oscillation delay occurs when the drive temperature is at high temperature if the bias current is small, and the power consumption at low temperature is greatly increased if the bias current is large.

The semiconductor laser drive method according to the present invention drives the semiconductor laser with the bias current as a linear function. Thus, a small bias current is obtained when the drive temperature is low temperature, and a large bias current is obtained when the drive temperature is high temperature, whereby extra power consumption can be reduced and the oscillation delay can be more or less completely suppressed.

Therefore, the output fluctuation of the surface emitting semiconductor laser in which the threshold current has an extreme value can be suppressed to a lower power consumption. Lower cost, space saving, and lower power can be realized, and the drive of the semiconductor laser that obtains satisfactory transmission characteristics and light output on the reception side over the entire drive temperature range can be realized.

In the present embodiment, the intersection of the threshold current and the bias current, that is, the temperature at which the current value of the threshold current and the current value of the bias current become equal is the upper limit temperature Th within the drive temperature range and the lower limit temperature Tl within the drive temperature range.

However, the temperature at which the current value of the threshold current and the current value of the bias current become equal is not necessarily limited to Th and Tl for the following reasons.

A case in which the current value of the threshold current and the current value of the bias current are equal is a case in which Ith(T) and Ib(T) are equal. In other words, a case in which the current value of the threshold current and the current value of the bias current are equal is a case in which the following quadratic equation (17) is satisfied.

"Right side of mathematical formula (1)=$rb(T-Tr)+Ib(Tr)$" (17)

In this case, the solution Ta of T in the mathematical formula (17) is a quadratic function, and thus has two solutions. The two solutions are Ta1 and Ta2 (assuming the solutions are different from each other, and Ta1<Ta2).

As described above, the bias current needs to be a current value greater than or equal to the threshold current over the entire drive temperature range to reduce the risk of causing oscillation delay. Such a condition can be satisfied by realizing the relationship Ta1≦Tl and Ta2≧Th for the lower temperature Ta1 and the higher temperature Ta2 when the current value of the threshold current and the current value of the bias current become equal.

It is to be recognized here that the slope rb of the line showing the temperature characteristics of the bias current changes when T1 and T2 change.

The drawbacks in data communication caused by the oscillation delay and the increase in power consumption caused by the lowering of the extinction ratio can be sufficiently suppressed if the slope rb is merely slightly changed. However, if the slope rb is greatly changed, the bias current Ib(Tl) at Tl and/or the bias current Ib(Th) at Th may greatly change to an extent the oscillation delay and the lowering of the extinction ratio cannot be suppressed.

Therefore, Ta1 may be set to any Ta1 as long as the relationship of Ta1≦Tl is satisfied, but the relationship of Ta1=Tl is desirable. Ta2 may be set to any T2a as long as the relationship of Ta2≧Th is satisfied, but the relationship of Ta2=Th is desirable.

Similarly in the following embodiments, the temperature at which the current value of the threshold current and the current value of the bias current become equal is Th and Tl.

However, similarly in the following embodiments, the temperatures Ta1 and Ta2 at which the current value of the threshold current and the current value of the bias current become equal may be any temperature as long as it satisfies the relationship Ta1≦Tl and Ta2≧Th, but the relationships Ta1=Tl and Ta2=Th are desirable.

Second Embodiment

Figure 6:
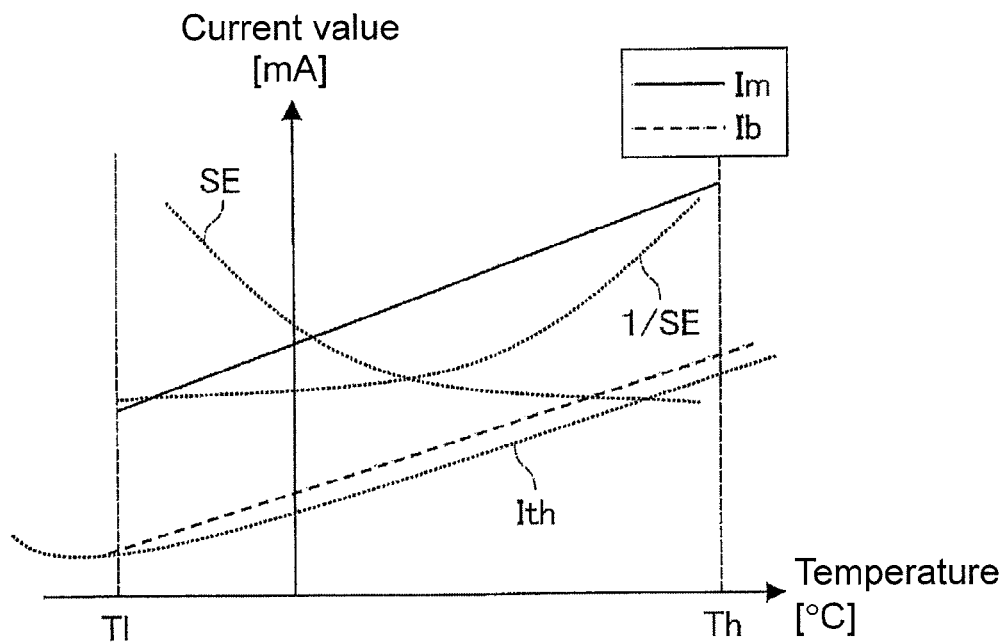
FIG. 6 is a graph showing another embodiment of the present invention, and showing a semiconductor laser drive method according to the present invention.

FIG. 6 is a view showing a semiconductor laser drive method according to another embodiment of the present invention. The embodiment shown in FIG. 6 satisfies conditions [1] to [5], similar to the semiconductor laser drive method shown in FIG. 1.

In the semiconductor laser drive method shown in FIG. 1, the extreme value of the temperature characteristics of the threshold current defined in condition [1] are set in the vicinity of the normal temperature. The temperature characteristics of the threshold current are a curve projecting downward with the vicinity of the normal temperature as the minimum value, as shown in FIG. 4, and the current value of the threshold current is relatively high at both the high temperature side and the low temperature side of the drive temperature range. Thus, it is difficult to sufficiently bring close the curve representing the temperature characteristics of the threshold current and the line representing the temperature characteristics of the bias current in the vicinity of the normal temperature, whereby it is not easy to suppress the fluctuation of the laser output light intensity.

In the semiconductor laser drive method shown in FIG. 6, the temperature characteristics of the threshold current are set to a value satisfying the mathematical formula (2), slightly modified from the mathematical formula (1).

$$Ith(T) = Ith(Tc)\exp\left[\left(\frac{T-Tc}{T_{01}}\right)^2 + \left(\frac{T-Tc}{T_{02}}\right)\right] \quad (2)$$

(where Tc: temperature where threshold current is minimum value (Tc≦Tl), Ith(Tc): Ith at Tc).

Therefore, the temperature characteristics of the threshold current are a curve projecting downward with the temperature of lower than or equal to Tl as the minimum value. The curve of the temperature characteristics of the threshold current more or less monotonously increases within the drive temperature range, and has a curve close to a line within the drive temperature range.

Consider a case in which the temperature characteristics of the bias current are a linear function with respect to the drive temperature, as indicated in condition [2]. In this case, in accordance with to condition [5], the bias current Ib and the slope rb serving as the slope of the bias current Ib are respectively set below as in mathematical formula (18)

$$Ib(T)=rb\cdot(T-Tr)+Ib(Tr) \quad (18)$$

and mathematical formula (19)

$$rb=[Ith(Th)-Ith(Tl)]/\Delta T \quad (19).$$

The curve of the temperature characteristics of the threshold current thus becomes a curve close to a line within the drive temperature range. The line of the temperature characteristics of the bias current becomes proximate to the curve of the temperature characteristics of the threshold current over the entire drive temperature range.

Therefore, the output fluctuation of the surface emitting semiconductor laser in which the threshold current has an extreme value can be suppressed to a lower power consumption. Lower cost, space saving, and lower power can be realized, and the drive of the semiconductor laser that obtains satisfactory transmission characteristics and light output on the reception side over the entire drive temperature range can be realized.

In the present embodiment, the curve representing the temperature characteristics of the threshold current and the line representing the temperature characteristics of the bias current can be brought close. Thus, the extinction ratio can be set high over the entire drive temperature range and the power consumption can be further reduced.

In the present embodiment, the extreme value of the temperature characteristics of the threshold current is set to a temperature lower than or equal to Tl. However, the temperature of setting the extreme value of the temperature characteristics of the threshold current is not limited thereto, and may be set to a temperature higher than or equal to Th. In other words, in the present embodiment, the extreme value of the temperature characteristics of the threshold current may be any value as long as it is set outside the drive temperature range.

Third Embodiment

A semiconductor laser drive method according to still another embodiment of the present invention will be described with reference to FIGS. 7 and 8.

In the embodiments described above, the temperature characteristics of the bias current and the drive current are determined focusing mainly on the oscillation delay time when the threshold current has an extreme value. In other words, the power consumption at the time of data communication can be reduced without causing drawbacks in the data communication originating from the oscillation delay by defining conditions [1] to [5] and determining the temperature characteristics of the bias current and the drive current that satisfy all the conditions.

In the present embodiment, a method of determining the temperature characteristics of the bias current and the drive current focusing mainly on the extinction ratio when the threshold current has an extreme value will be described.

The circuit configuration of the light transmission device necessary for executing the semiconductor laser drive method according to the present embodiment may be the same as the light transmission device 2a. The circuit configuration of the light transmission device 2a may be the circuit configuration shown in FIG. 3. In the present embodiment, the slope of a line of the temperature characteristics of the bias current is r1 and the slope of a line of the temperature characteristics of the drive current is r2.

The method of setting the temperature characteristics of the bias current and the drive current for implementing the semiconductor laser drive method according to the present embodiment will now be described.

Figure 7:
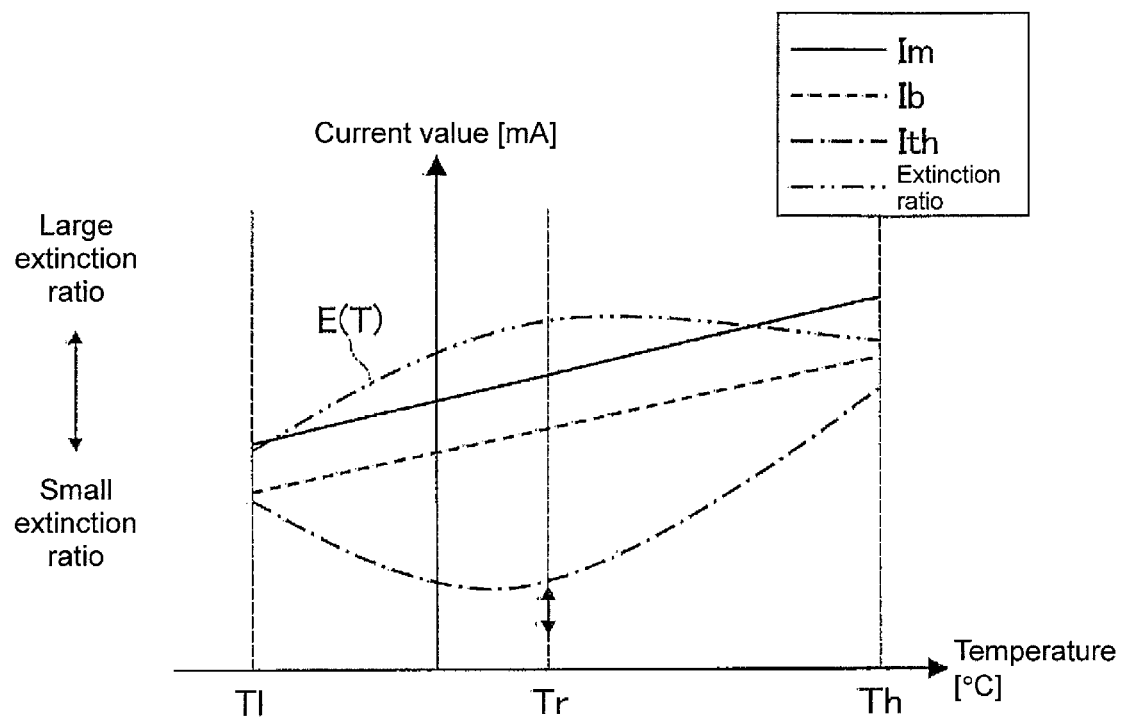
FIG. 7 is a graph showing still another embodiment of the present invention, and showing a semiconductor laser drive method according to the present invention.

FIG. 7 is a view showing the semiconductor laser drive method according to the present embodiment. Similar to FIG. 1, the temperature characteristics of the threshold current shown in FIG. 7 have a curve projecting downward with the vicinity of the normal temperature as a minimum value, and the current value of the threshold current becomes relatively high at both the high temperature side and the low temperature side of the drive temperature range.

The semiconductor laser drive method according to the present embodiment shown in FIG. 7 drives the semiconductor laser with the bias current and the drive current that satisfy condition [11] defining the upper limit of the bias current and the drive current, condition [12] defining that the extinction ratio is a value greater than or equal to a constant in the drive temperature at which the output light intensity of the semiconductor laser becomes a minimum within the drive temperature range, condition [13] defining that the bias current is a current value greater than or equal to the threshold current over the entire range of the drive temperature range, and condition [14] defining that the light receiving quantity of the light receiving element of the light reception device 3 is greater than or equal to a minimum light receiving sensitivity (minimum power of incident light that can be received by the light reception device 3) of the light receiving IC of the light reception device 3 over the entire range of the drive temperature range.

The method of setting the temperature characteristics of the bias current Ib(Tr) and the drive current Im(Tr) when the drive temperature is the normal temperature determined by conditions [11] to [14] will be described.

First, condition [11] will be described.

Condition [11] is a condition defined by the characteristics of the IC incorporating the surface emitting semiconductor laser. Condition [11] thus can be arbitrarily set according to the characteristics of the IC to use.

Figure 8:
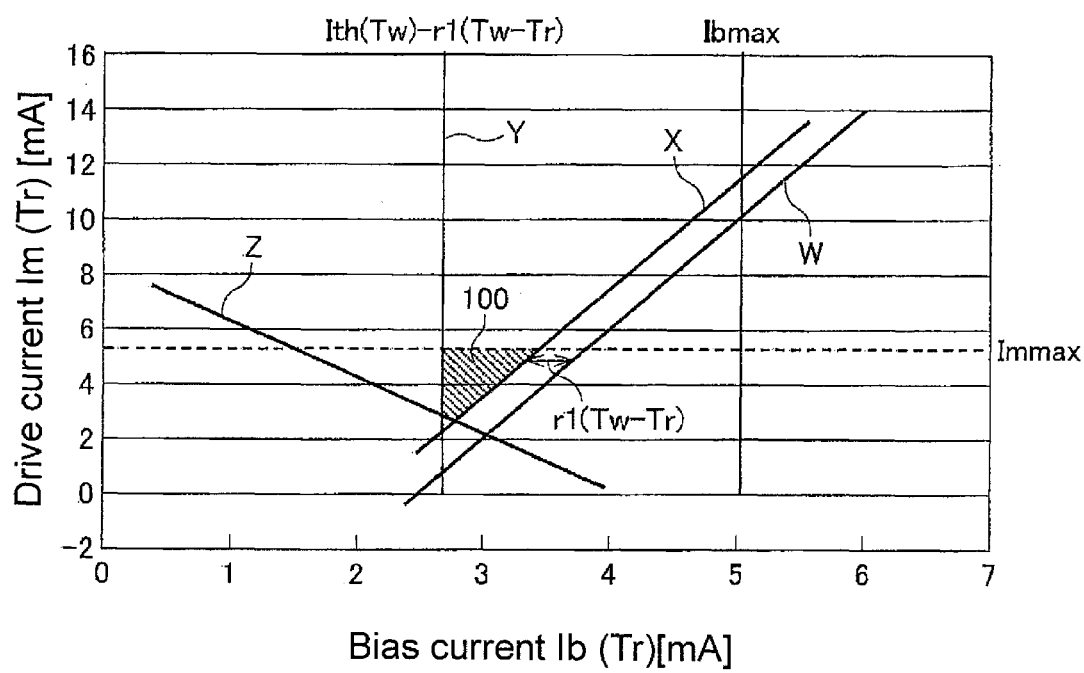
FIG. 8 is a graph showing a relationship between a bias current and a drive current at a normal temperature in the graph shown in FIG. 7.

FIG. 8 is a view showing a relationship between the bias current and the drive current in the semiconductor laser drive method according to the present embodiment. In FIG. 8, the upper limit of the drive current is Immax and the upper limit of the bias current is Ibmax when the drive temperature is a normal temperature. Therefore, condition [11] is a region in which the drive current is smaller than or equal to the upper limit Immax and the bias current is smaller than or equal to the upper limit Ibmax in FIG. 8.

Condition [12] will now be described.

As described above, when the threshold current becomes large, the power of the output light of the surface emitting semiconductor laser obtained by a predetermined bias current and drive current becomes small compared to when the threshold current is small. In order to accurately execute the data communication by the surface emitting semiconductor laser in this case, the power needs to be within the dynamic range of the light reception device 3 even when the power of the output light of the surface emitting semiconductor laser lowers.

The relationship between the extent of the dynamic range and the extinction ratio will now be considered.

In the case of the threshold current Ith, the bias current Ib, and the drive current Im, the extinction ratio is $(Im+Ib-Ith)/(Ib-Ith)$. Small extinction ratio expressed with such a mathematical formula means that the difference between the drive current Im and the bias current Ib is small. In other words, when the extinction ratio become small, the optical signal outputted by the surface emitting semiconductor laser has a small difference in the amplitude of the signal of "1" and the amplitude of the signal of "0".

The noise level of the optical signal does not depend on the fluctuation in the difference between the amplitude of the signal of "1" and the amplitude of the signal of "0". Thus, the signal to noise ratio (SN ratio) of the optical signal becomes small due to the fluctuation in the difference between the amplitude of the signal of "1" and the amplitude of the signal of "0". The minimum light receiving sensitivity of the light receiving IC of the light reception device 3 is determined by the SN ratio of the optical signal, and the minimum light receiving sensitivity becomes smaller with reduction of the SN ratio, whereby the reduction of the SN ratio means narrower dynamic range.

Therefore, high extinction ratio needs to be maintained when the power of the output light is low to normally execute the reception of the output light by the light reception device 3.

If the power of the output light of an extent reception of the output light by the light reception device 3 is possible is not obtained at the drive temperature Tw at which the output light intensity of the surface emitting semiconductor laser becomes a minimum in the drive temperature range, the reception of the output light by the light reception device 3 is obviously impossible when the drive temperature is Tw. Reception becomes impossible in order from the portion of low output light intensity of the surface emitting semiconductor laser the smaller the extinction ratio.

Therefore, it can be assumed that the width of the dynamic range depends on the extinction ratio. In other words, the dynamic range becomes wider as the extinction ratio increases and the dynamic range becomes narrower as the extinction ratio decreases.

Therefore, the current values of the bias current and the drive current are adjusted to an extent the extinction ratio enabling only the reception of the output light by the light reception device 3 is obtained at Tw. Therefore, the surface emitting semiconductor laser can be driven without arising drawbacks in the data communication caused by the lowering of the extinction ratio over the entire drive temperature range. The detailed description of Tw will be described later.

In view of the above, the set range of the extinction ratio E in which the reception of the output light by the light reception device 3 is possible is obtained by the following mathematical formula (20).

$$[Ib(Tw)+Im(Tw)-Ith(Tw)]/[Ib(Tw)-Ith(Tl)] \geq E \quad (20)$$

(where Tw: drive temperature at which output light intensity of surface emitting semiconductor laser is minimum in drive temperature range; Ib(Tw): bias current at Tw; Im(Tw): drive current at Tw; Ith(Tw): threshold current at Tw; E: predetermined value of extinction ratio)

Expressing the region satisfying the mathematical formula indicating the set range of the extinction ratio E with the bias current Ib(Tw) and the drive current Im(Tw) at Tw, the region is on the line segment W or above the line segment W in FIG. 8. The line segment W can always be represented with a line since the extinction ratio E is a constant.

Furthermore, since the temperature characteristics of the bias current are represented with a line having a slope r1, the bias current Ib(Tr) in the case where the drive temperature is a normal temperature shifts in the direction the bias current changes by r1(Tr−Tw) from the line segment W. In other words, expressing the region satisfying the mathematical formula indicating the set range of the extinction ratio E with the bias current Ib(Tr) and the drive current Im(Tr) in the case where the drive temperature is the normal temperature, the region is on the line segment X or above the line segment X in FIG. 8, which is shifted in the direction the bias current changes by r1(Tr−Tw) from the line segment W in FIG. 8. The region on the line segment X or above the line segment X in FIG. 8 corresponds to the region that satisfies condition [12].

Condition [13] will now be described.

The oscillation delay needs to be more or less completely suppressed when performing a high speed transmission of 1 Gbps order, as mentioned above. The bias current and the drive current thus need to be set to values of an extent drawbacks in the data communication caused by the oscillation delay do not arise over the entire drive temperature range.

The condition for the bias current Ib to always be larger than the threshold current Ith is expressed with mathematical formula (21).

$$Ib(Tr) \geq Ith(Tw)-r1(Tw-Tr) \quad (21)$$

In other words, since the temperature characteristics of the bias current are represented with a line having a slope r1, the requisite minimum current value of the bias current at Tw can be expressed with the above mathematical formula using the bias current Ib(Tr) in the case where the drive temperature is the normal temperature.

Expressing the region satisfying the mathematical formula indicating the condition for the bias current Ib to always be larger than the threshold current Ith with the bias current Ib(Tr) in the case where the drive temperature is the normal temperature, the region is on the line segment Y or right of the line segment Y in FIG. 8 (region where bias current becomes large). The region on the line segment Y or on the right of the line segment Y corresponds to the region that satisfies condition [13].

Lastly, condition [14] will be described.

The condition for the light receiving quantity of the light receiving element of the light reception device 3 to be greater than or equal to the minimum light receiving sensitivity of the light receiving IC of the light reception device 3 over the entire range of the drive temperature range is as expressed with mathematical formula (22).

$$\alpha P \geq Pmin \quad (22)$$

(where α: light loss in path between light emitting element 25 of light transmission device 2a and light receiving element of light reception device 3; Pmin: minimum light receiving sensitivity)

Applying a relational expression (P=η(Im+Ib−Ith) of the power P of the output light of the surface emitting semiconductor laser and the slope efficiency η used in the above-described embodiment to mathematical formula (22), the following mathematical formula (23) is obtained.

$$\alpha\eta(Ib+Im-Ith) \geq Pmin \quad (23)$$

According to this mathematical formula, the condition of the drive current Im(Tw) at the drive temperature Tw at which the output light intensity of the surface emitting semiconductor laser becomes a minimum in the drive temperature range is obtained by mathematical formula (24).

$$Im(Tw) \geq -Ib(Tw)+Ith(Tw)+(Pmin/\alpha\eta) \quad (24)$$

Since the temperature characteristics of the bias current are represented with a line having a slope r1 and the temperature characteristics of the drive current are represented with a line having a slope r2, the current values of the bias current Ib(Tr) in the case where when the drive temperature is the normal temperature and the drive current Im(Tr) in the case where the drive temperature is the normal temperature are respectively expressed with mathematical formulas (25) and (26).

$$Ib(Tr)=Ib(Tw)+r1(Tw-Tr) \quad (25)$$

$$Im(Tr)=Im(Tw)+r2(Tw-Tr) \quad (26)$$

Substituting such mathematical formulas to the mathematical formula indicating the condition of the drive current Im(Tw) at Tw, the condition of the drive current Im(Tr) in the case where the drive temperature is the normal temperature can be expressed with mathematical formula (27).

$$Im(Tr) \geq Ib(Tr)+(r2-r1)\cdot(Tw-Tr)+Ith(Tw)+(Pmin/\alpha\eta) \quad (27)$$

Expressing the region satisfying the mathematical formula indicating the condition for the light receiving quantity of the light receiving element of the light reception device 3 to be greater than or equal to the minimum light receiving sensitivity of the light receiving IC of the light reception device 3 over the entire range of the drive temperature range with the bias current Ib(Tr) and the drive current Im(Tr) in the case where the drive temperature is the normal temperature, the region is on the line segment Z or above the line segment Z in FIG. 8. The region on the line segment Z or above the line segment Z corresponds to the region that satisfies condition [14].

As a result, the region 100 surrounded by the upper limit Immax, the line segment X, the line segment Y, and the line segment Z in FIG. 8 becomes the range of the current values of the bias current Ib(Tr) and the drive current Im(Tr) in the case where the drive temperature is the normal temperature that satisfies conditions [11] to [14]. The bias current Ib(Tr) and the drive current Im(Tr) in the case where the drive temperature is the normal temperature are set within the region 100. The semiconductor laser drive method according to the present embodiment is thereby implemented.

The drive temperature Tw at which the extinction ratio becomes a minimum in the drive temperature range will now be described.

As described above, the temperature characteristics of the threshold current often have an extreme value in the case of the surface emitting semiconductor laser. In this case, the temperature characteristics of the threshold current of the surface emitting semiconductor laser are a curve projecting downward with the vicinity of the normal temperature as the minimum value, and the current value of the threshold current becomes relatively high at both the high temperature side and the low temperature side of the drive temperature range.

When the surface emitting semiconductor laser has such temperature characteristics of the threshold current and the bias current, the temperature characteristics of the drive current in which the extinction ratio becomes the predetermined value E are represented with a curve projecting upward with the vicinity of the normal temperature as a maximum value when the temperature characteristics of the drive current in which the extinction ratio becomes the predetermined value E are derived according to the mathematical formula indicating the set range of the extinction ratio E. In other words, when the temperature characteristics of the drive current are a linear function with respect to the drive temperature, the temperature characteristics of the extinction ratio become a curve projecting downward with the vicinity of the normal temperature as a minimum value, and the extinction ratio increases as the temperature approaches the upper limit temperature Th or the lower limit temperature Tl.

Therefore, if the temperature characteristics of the threshold current have an extreme value, the drive temperature Tw at which the output light intensity of the surface emitting semiconductor laser becomes a minimum is always either the upper limit temperature Th or the lower limit temperature Tl. In other words, the temperature at which the output light intensity of the surface emitting semiconductor laser at the relevant temperature is smaller of the upper limit temperature Th or the lower limit temperature Tl is Tw.

The curve E(T) shown in FIG. 7 is the temperature characteristics of the drive current in which the extinction ratio becomes the predetermined value E obtained from the temperature characteristics of the threshold current, the bias current, and the drive current shown in FIG. 7 using the mathematical formula indicating the set range of the extinction ratio E. In the case of FIG. 7, the drive temperature Tw at which the extinction ratio becomes a minimum is the lower limit temperature Tl of the drive temperature range.

Therefore, the extinction ratio enabling only the reception of the output light by the light reception device 3 is obtained at Tl, whereby the semiconductor laser drive method according to the present embodiment can be implemented by adjusting the current values of the bias current and the drive current in the above manner.

In FIG. 7, the extinction ratio at the vicinity of the normal temperature is lower than the predetermined value E of the extinction ratio. In this case, however, troubles do not arise in the reception of the output light by the light reception device 3 since the output light intensity of the surface emitting semiconductor laser is sufficiently large.

The output fluctuation of the surface emitting semiconductor laser in which the threshold current has an extreme value thus can be suppressed to a lower power consumption. Lower cost, space saving, and lower power can be realized, and the semiconductor laser drive method in which satisfactory transmission characteristics and light output can be obtained on the reception side over the entire drive temperature range can be realized.

Furthermore, the present embodiment has the following effects.

In the conventional semiconductor laser drive method, the extinction ratio is set to greater than or equal to the predetermined value over the entire drive temperature range. Thus, in the case of the surface emitting semiconductor laser in which the temperature characteristics of the threshold current have an extreme value, the current values of the bias current and the drive current become uselessly large at the vicinity of the normal temperature where the output light intensity of the surface emitting semiconductor laser is relatively large, whereby the power consumption increases.

In the semiconductor laser drive method according to the present embodiment, on the other hand, the current values of the bias current and the drive current are set to ensure the extinction ratio enabling only the reception of the output light by the light reception device 3 at the drive temperature at which the output light intensity of the surface emitting semiconductor laser becomes a minimum. Therefore, the bias current and the drive current can be further reduced at the vicinity of the normal temperature where the output light intensity of the surface emitting semiconductor laser is relatively large, and the power consumption can be further reduced.

Similar to the embodiments described above, the present embodiment describes a case in which the extreme value of the temperature characteristics of the threshold current is set within the drive temperature range, by way of example. However, the extreme value of the temperature characteristics of the threshold current is not necessarily set within the drive temperature range. In other words, in the present embodiment, the extreme value of the temperature characteristics of the threshold current may be set to a temperature outside the drive temperature range, similar to the embodiment shown in FIG. 6.

Furthermore, similarly in the embodiments to be described later, the extreme value of the temperature characteristics of the threshold current may be set to a temperature within the drive temperature range or may be set to a temperature outside the drive temperature range.

Fourth Embodiment

The semiconductor laser drive method according to the present embodiment will be described with reference to FIGS. 9 and 10.

In the present embodiment, a condition [15] that the bias current Ib(Tl) at Tl and the threshold current Ith(Tl) at Tl match and that the bias current Ib(Th) at Th and the threshold current Ith(Th) at Th match is set in addition to conditions [11] to [14] of the above-described embodiments.

Condition [15] will now be described.

To satisfy condition [15], the slope r1 of the bias current may be set as mathematical formula (28) below.

$$r1=[Ith(Th)-Ith(Tl)]/(Th-Tl) \quad (28)$$

When the slope r1 of the bias current is set as above, the bias current Ib(Tr) in the case where the drive temperature is the normal temperature can be expressed as in mathematical formula (29).

$$Ib(Tr)=[Ith(Tl)-(Ith(Th)-Ith(Tl))\cdot(Tl-Tr)]/(Th-Tr) \quad (29)$$

Figure 9:
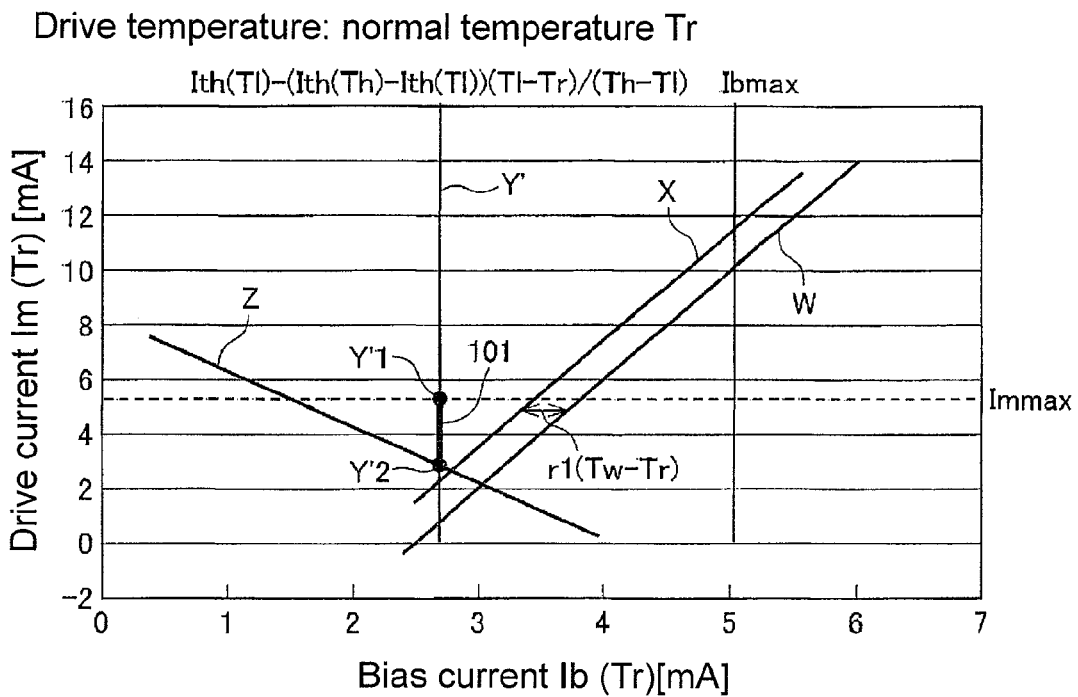
FIG. 9 is a graph showing a relationship between a bias current and a drive current at a normal temperature according to another embodiment of the present invention.

FIG. 9 is a view showing a relationship between the bias current and the drive current in the semiconductor laser drive method according to the present embodiment. FIG. 9 shows the line segment Y' defined by condition [15] in addition to the upper limit Ibmax of the bias current and the upper limit Immax of the drive current defined by condition [11], the line segment W and the line segment X defined by condition [12], and the line segment Z defined by condition [14] of FIG. 8.

In FIG. 9, the region satisfying condition [15] is, without saying, on the line segment Y'.

Therefore, the line of the line segment 101 defined by the intersection Y'1 of the line segment Y' and the Immax and the intersection Y'2 of the line segment Y' and the line segment Z is the range of the current values of the bias current Ib(Tr) and the drive current Im(Tr) in the case where the drive temperature is the normal temperature that satisfies conditions [11] to [15]. The bias current Ib(Tr) and the drive current Im(Tr) in the case where the drive temperature is the normal temperature are set on the line segment 101. The semiconductor laser drive method according to the present embodiment is thereby implemented.

Figure 10:
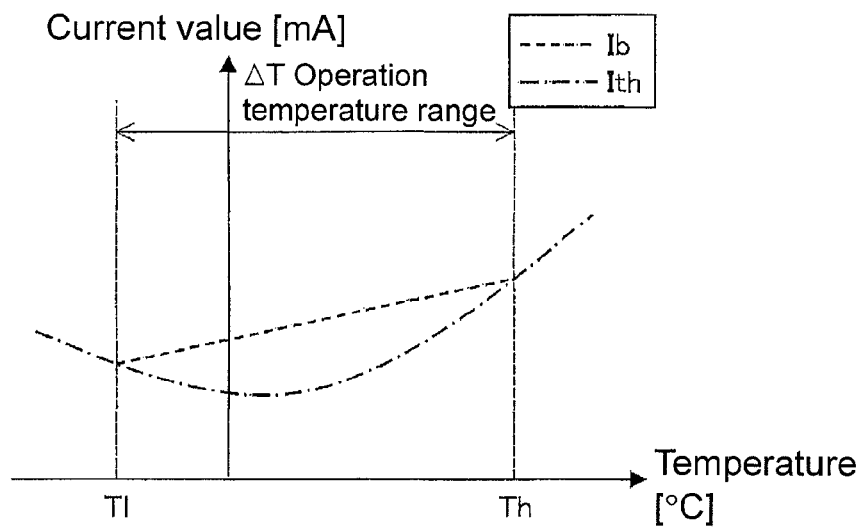
FIG. 10 is a graph showing temperature characteristics when the semiconductor laser is driven based on the bias current and the drive current shown in FIG. 9.

The temperature characteristics of the bias current Ib and the threshold current Ith when the surface emitting semiconductor laser is driven by the thus derived bias current Ib(Tr) in the case where the drive temperature is the normal temperature are shown in FIG. 10.

As apparent from FIG. 10, a line showing the temperature characteristics of the bias current Ib and a line showing the temperature characteristics of the threshold current Ith coincide at Tl and Th.

The power consumption by the bias current thus can be further reduced by setting the bias current Ib(Tr) in the case where the drive temperature is the normal temperature in the above manner.

The present embodiment may be combined with the embodiment shown in FIG. 6. In other words, the extreme value of the threshold current may be set outside the drive temperature range in the present embodiment.

Fifth Embodiment

The semiconductor laser drive method according to the present embodiment will be described with reference to FIG. 11.

The method of setting the current values of the bias current Ib(Tr) and the drive current Im(Tr) in the case where the drive temperature is the normal temperature at which the power consumption can be reduced the most of the region 100 defined in the above-described embodiment shown in FIG. 7. will now be described.

The region 100 in FIG. 7 is a region indicating that the oscillation delay does not occur and the power consumption can be reduced regardless of the portion in the region the bias current Ib(Tr) and the drive current Im(Tr) in the case where the drive temperature is the normal temperature are set.

Thus, the current values of the bias current Ib(Tr) and the drive current Im(Tr) in the case where the drive temperature is the normal temperature may be any value as long as they are both in the region 100.

The current value of the bias current Ib(Tr) in the case where the drive temperature is the normal temperature is set on the line segment Y, that is, the value satisfying mathematical formula (30).

$$Ib(Tr)=Ith(Tw)-r1(Tw-Tr) \quad (30)$$

In this case, the current value of the drive current Im(Tr) in the case where the drive temperature is the normal temperature is set to the intersection of the line segment Y and the line segment Z, that is, the value satisfying the following mathematical formulas (31) and (32).

$$Im(Tr)=-Ib(Tr)+(r2-r1)\cdot(Tw-Tr)+Ith(Pmin/\alpha\eta) \quad (31)$$

and $$Im(Tr)=Im(Tw)-r2(Tw-Tr) \quad (32)$$

Figure 11:
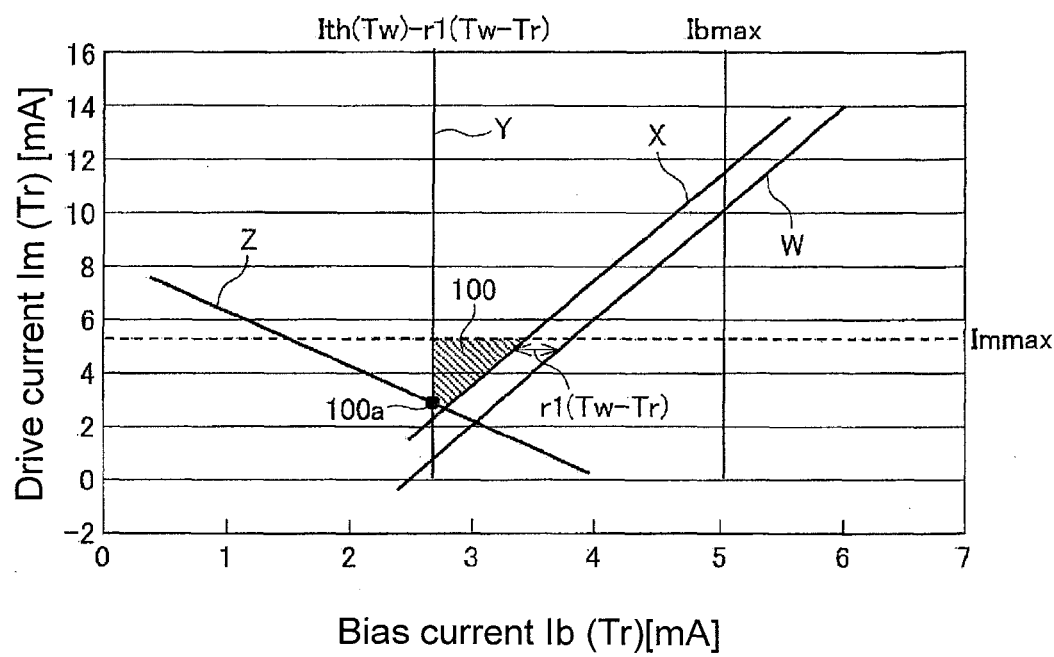
FIG. 11 is a graph showing a relationship between a bias current and a drive current at a normal temperature according to still another embodiment of the present invention.

FIG. 11 is a view showing the minimum values of the current values of the bias current Ib(Tr) and the drive current Im(Tr) in the case where the drive temperature is the normal temperature in the region 100 defined based on the above three mathematical formulas (30) to (32). Point 100a in FIG. 11 shows the current values of the bias current Ib(Tr) and the drive current Im(Tr) in the case where the drive temperature is the normal temperature at which the power consumption can be reduced the most in the region 100.

The present embodiment may be combined with the embodiment shown in FIG. 6. In other words, the extreme value of the threshold current may be set outside the drive temperature range in the present embodiment.

An example in which the power consumption can be reduced the most in the embodiments described up to now is the example combining the present embodiment and the embodiment shown in FIG. 6. In other words, an example in which the power consumption can be reduced the most in the first to the fifth embodiments is the example in which the extreme value of the temperature characteristics of the threshold current is set to a temperature outside the drive temperature range, as shown in the second embodiment, in the fifth embodiment.

Sixth Embodiment

The semiconductor laser drive method according to the present embodiment will be described with reference to FIGS. 12 and 13.

In the present embodiment, condition [16] defining that the extinction ratio is a value smaller than or equal to the predetermined value at the normal temperature is set in addition to conditions [11] to [14] of the above-described embodiments.

Condition [16] will now be described.

The set range of the predetermined extinction ratio Er at the normal temperature Tr is obtained by mathematical formula (33).

$$[Ib(Tr)+Im(Tr)-Ith(Tr)]/[Ib(Tr)-Ith(Tl)]\geq Er \quad (33)$$

The method of setting the numerical value of the predetermined extinction ratio Er takes into view to what extent of value the extinction ratio at the normal temperature needs to be greater than or equal to, and appropriately determines the same, where the extinction ratio Er is desirably set in a range of 2 to 4 dB, as specific values.

Figure 12:
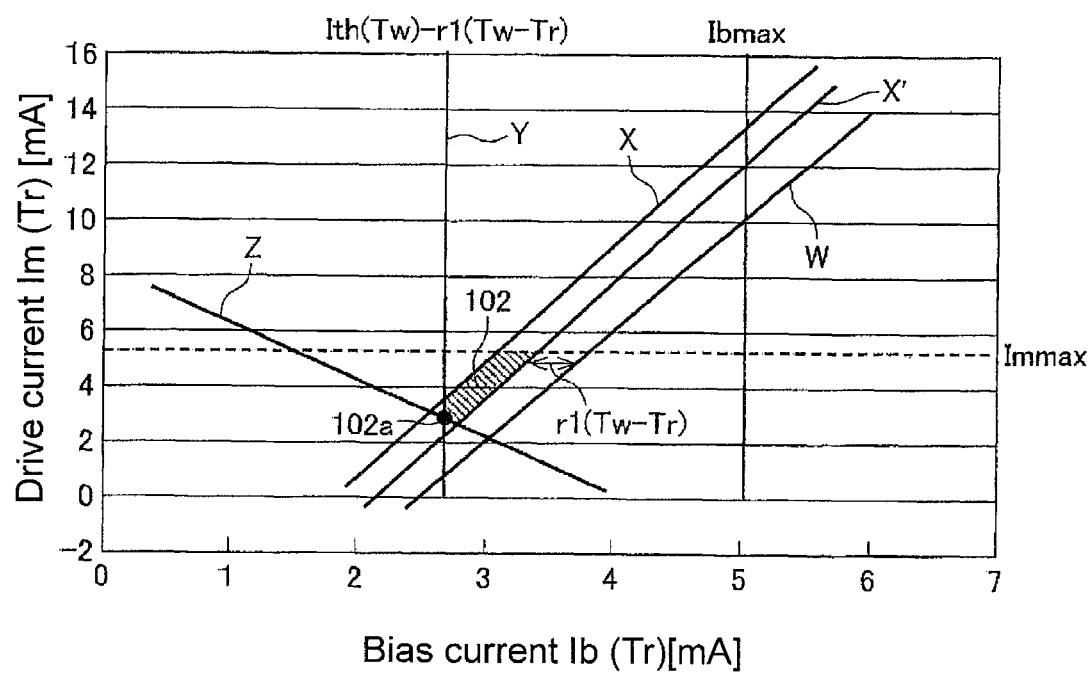
FIG. 12 is a graph showing a relationship between a bias current and a drive current at a normal temperature according to yet another embodiment of the present invention.

Expressing the region satisfying the mathematical formula indicating the condition defining that the extinction ratio is a value smaller than or equal to a predetermined value at the normal temperature with the bias current Ib(Tr) and the drive current Im(Tr) in the case where the drive temperature is the normal temperature, the region is on the line segment X' or above the line segment X' in FIG. 12. The region on the line segment X' or above the line segment X' corresponds to the region satisfying condition [16]. The line segment X' is always represented with a line since the extinction ratio Er is a constant, and the line segment X' is parallel to the line segment X.

As a result, the region 102 surrounded by the upper limit Immax, the line segment X, the line segment Y, the line segment Z, and the line segment X' in FIG. 12 becomes the range of the current values of the bias current Ib(Tr) and the drive current Im(Tr) in the case where the drive temperature is the normal temperature that satisfies conditions [11] to [14] and [16]. The bias current Ib(Tr) and the drive current Im(Tr) in the case where the drive temperature is the normal temperature are set within the region 102. The semiconductor laser drive method according to the present embodiment is thereby implemented.

The current values of the bias current Ib(Tr) and the drive current Im(Tr) in the case where the drive temperature is the normal temperature at which the power consumption can be reduced the most in the region 102 of FIG. 12 can be derived through an idea similar to the above-described embodiments.

In other words, the current value of the bias current Ib(Tr) in the case where the drive temperature is the normal temperature is set on the line segment Y, that is, to Ib(Tr)=Ith(Tw)−r1(Tw−Tr), and the current value of the drive current Im(Tr) in the case where the drive temperature is the normal temperature is set to the intersection of the line segment Y and the line segment Z, that is, the value satisfying mathematical formula (34), $$Im(Tr) = -Ib(Tr) + (r2-r1) \cdot (Tw-Tr) + Ith(Tw) + (P\min/\alpha\eta) \quad (34)$$

and mathematical formula (35)

$$Im(Tr) = Im(Tw) - r2(Tw-Tr) \quad (35)$$

Point 102a in FIG. 12 shows the current values of the bias current Ib(Tr) and the drive current Im(Tr) in the case where the drive temperature is the normal temperature at which the power consumption can be reduced the most in the region 102.

Figure 13:
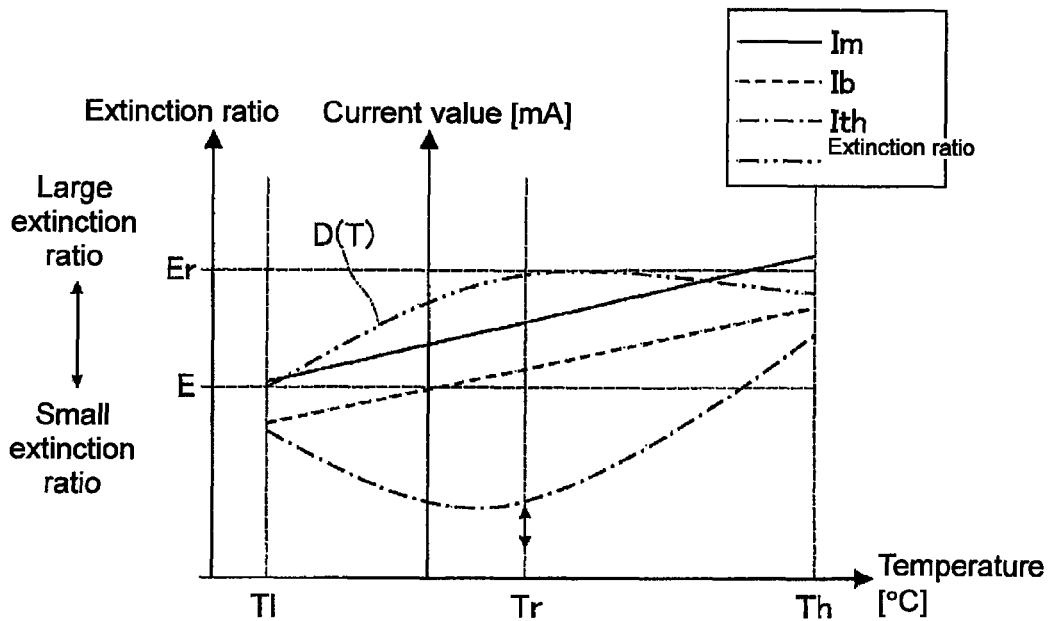
FIG. 13 is a graph showing temperature characteristics when the semiconductor laser is driven based on the bias current and the drive current shown in FIG. 12.

The temperature characteristics of the threshold current Ith and the bias current Ib when the surface emitting semiconductor laser is driven by the bias current Ib(Tr) in the case where the drive temperature is the normal temperature obtained through the above conditions are shown in FIG. 13.

As shown in FIG. 13, in the case of the present embodiment, the temperature characteristics of the extinction ratio become a curve D(T), but it is apparent from the figure that the extinction ratio is greater than or equal to E and smaller than or equal to Er when driven at the normal temperature.

Therefore, the change in extinction ratio caused by the change in drive temperature can be reduced by setting the extinction ratio at the vicinity of the normal temperature to a value smaller than or equal to a predetermined extinction ratio Er. In other words, the value of the extinction ratio stabilizes over the entire drive temperature range. Therefore, very stable transmission characteristics and light output can be obtained on the reception side.

Seventh Embodiment

The semiconductor laser drive method according to the present embodiment will be described with reference to FIG. 14.

In the present embodiment, condition [17] defining that the fluctuation range of the power of the output light is a value smaller than or equal to a predetermined value in the entire drive temperature range is set in addition to conditions [11] to [14] of the above-described embodiments.

Condition [17] will now be described.

With the lower limit in the fluctuation range of the power of the output light in the entire drive temperature range as m1 and the upper limit as m2, the fluctuation range of the power of the output light is obtained by the following mathematical formula (36).

$$m1 < Pm(T) + Pb(T) < m2 \quad (36)$$

(where Pm(T): intensity of output light by drive current at drive temperature T, Pb(T): intensity of output light by bias current at drive temperature T)

More specifically, the mathematical formula (36) can be modified to mathematical formula (37).

$$m1 < [Im(Tr) + 2Ib(Tr) - (Ith(Tl) + Ith(Tr))Vcc < m2 \quad (37)$$

(where Ib(T): bias current at drive temperature T, Im(T): drive current at drive temperature T, Ith(T): threshold current at drive temperature T, Vcc: voltage value of power supply 21).

In other words, the fluctuation range of the power of the output light can be set to a value smaller than or equal to a predetermined value over the entire drive temperature range by satisfying the mathematical formula (37) defining the fluctuation range of the power of the output light at all drive temperatures T satisfying Tl<T<Th.

The method of setting the lower limit m1 and the upper limit m2 of the fluctuation range of the power of the output light takes into view to what extent of the value the fluctuation range of the power of the output light in the entire drive temperature range is to be suppressed, and appropriately determines the same, where the lower limit m1 and the upper limit m2 of the fluctuation range of the power of the output light are desirably set such that the difference is in a range of 3 to 4 dB, as specific values.

Figure 14:
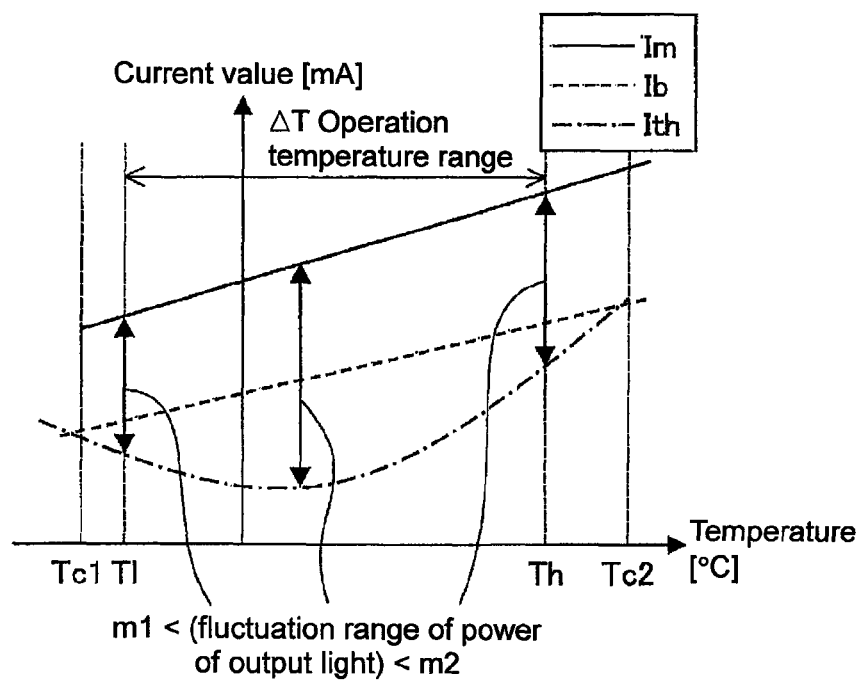
FIG. 14 is a graph showing yet another embodiment of the present invention, and showing a semiconductor laser drive method according to the present invention.

The temperature characteristics of the threshold current Ith, the bias current Ib, and the drive current Im when the surface emitting semiconductor laser is driven by the bias current Ib(Tr) and the drive current Im(Tr) in the case where the drive temperature is the normal temperature obtained through the above conditions are shown in FIG. 14.

As shown in FIG. 14, the fluctuation range of the power of the output light is greater than or equal to m1 and smaller than or equal to m2 in the entire drive temperature range.

The output fluctuation originating from the drive temperature thus can be suppressed to smaller than or equal to a constant value over the entire drive temperature range. In other words, very stable transmission characteristics and light output can be obtained on the reception side since the power of the output light can be suppressed to within a range of the output fluctuation desired by the optical wiring module over the entire drive temperature range.

Eighth Embodiment

In the above-described embodiments, the semiconductor laser drive method has been described in which the power consumption can be reduced without causing drawbacks in the data communication originating from the oscillation delay and the lowering of the extinction ratio by devising the method of setting the temperature characteristics of the threshold current, the bias current, and the drive current.

It is to be noted that the temperature characteristics of the threshold current of the surface emitting semiconductor laser vary depending on the Typ characteristics. Similarly when setting the temperature characteristics of the bias current therewith by the method of the above-described embodiment, the characteristics thereof are influenced by such variation.

In the present embodiment, the method of setting the temperature characteristics of the bias current in view of the variation of the temperature characteristics of the threshold current will be described with reference to FIGS. 15 to 17.

Figure 15:
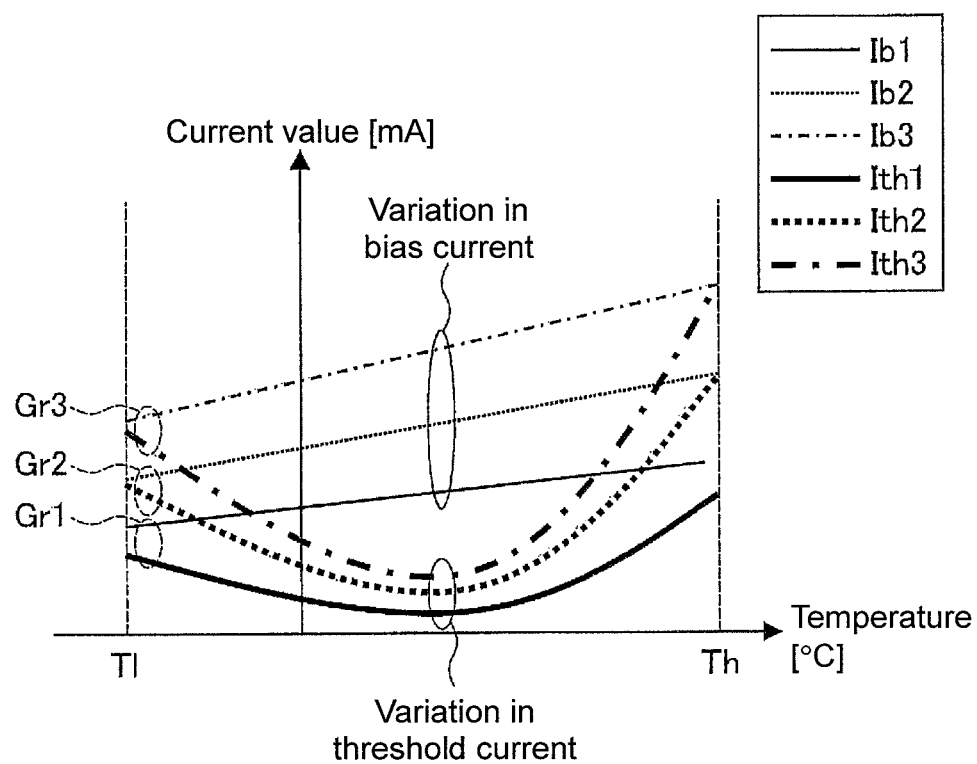
FIG. 15 is a diagram showing a method of setting temperature characteristics of a bias current when the temperature characteristics of the threshold current shown in FIG. 1 vary.

FIG. 15 is a diagram showing a method of setting the temperature characteristics of the bias current when the temperature characteristics of the threshold current vary.

In FIG. 15, the threshold current varies by the Typ characteristics, and three temperature characteristics, Ith1, Ith2, and Ith3, are shown. The difference sth between the threshold current Ith(Th) at Th and the threshold current Ith(Tl) at Tl has a relationship of mathematical formula (38).

$$sth(Ith3) > sth(Ith2) > sth(Ith1) \quad (38)$$

(where sth(Ith3): sth at Ith3, sth(Ith2): sth at Ith2, sth(Ith1): sth at Ith1).

Accompanied therewith, a pattern in which the bias current has three temperature characteristics of Ib1, Ib2, and Ib3 is considered. The difference sb between the bias current Ib(Th) at Th and the bias current IN(Tl) at Tl has a relationship of mathematical formula (39).

$$sb(Ib3) > sb(Ib2) > sb(Ib1) \quad (39)$$

(where sb(Ib3): sb at Ib3, sb(Ib2): sb at Ib2, sb(Ib1): sb at Ib1).

Therefore, the slope rb of the bias current similarly has a relationship of mathematical formula (40).

$$rb(Ib3) > rb(Ib2) > rb(Ib1) \quad (40)$$

(where rb(Ib3): rb at Ib3, rb(Ib2): rb at Ib2, rb(Ib1): rb at Ib1).

Ib3 in which rb is large is desirably set for the bias current if sth is large as in Ith3, Ib3 in which rb is normal is desirably set for the bias current if sth is normal as in Ith2, and Ib1 in which rb is small is desirably set for the bias current if sth is small as in Ith1. The bias current thus can be appropriately set even when the temperature characteristics of the threshold current vary by setting the temperature characteristics of the bias current with the difference between the threshold current at the upper limit temperature within the drive temperature range and the threshold current at the lower limit temperature within the drive temperature range, and the slope of the temperature characteristics of the bias current in correspondence to each other.

The method of setting the temperature characteristics of the bias current in view of the variation of the temperature characteristics of the threshold current in the embodiment shown in FIG. 1 will be described with reference to FIGS. 16 and 17. The tolerable range of the slope of the bias current Ib, that is, the tolerable range of the slope rb will be described for the method of setting the temperature characteristics of the bias current.

If the slope rb is too large, the extinction ratio degrades at Tl and the power consumption increases. If too small, the bias current Ib becomes considerably smaller than the threshold current Ith at Th, whereby the transmission characteristics on the light reception device side are disturbed by the oscillation delay and drawbacks arise in the data communication. Thus, consideration is ultimately made on the slope rb enabling the performance that allows the use of the optical wiring module to be maintained and the power consumption to be sufficiently lowered in the transmission speed band of the optical wiring module mounted with the surface emitting semiconductor laser.

First, consider a case in which the slope rb becomes a maximum.

Figure 16:
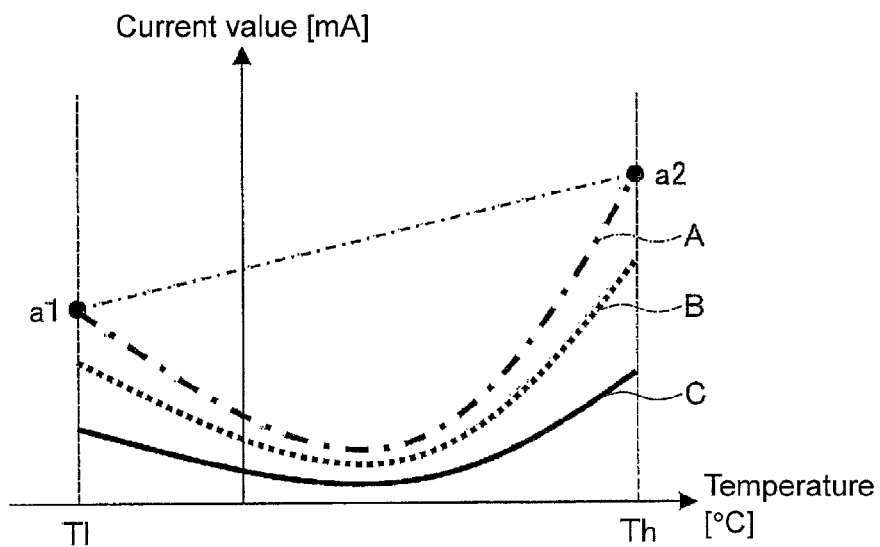
FIG. 16 is a diagram showing temperature characteristics of a bias current where the slope becomes a maximum when the temperature characteristics of the threshold current shown in FIG. 1 vary.

FIG. 16 is a diagram showing the temperature characteristics of the bias current Ib when the slope rb becomes a maximum in a case in which the temperature characteristics of the threshold current shown in FIG. 1 vary. All of the curves A to C are curves showing the temperature characteristics of the threshold current varied according to the Typ characteristics.

The case in which the slope rb becomes a maximum is a case in which the temperature characteristics where the difference between Ith(Th) and Ith(Tl), that is, sth becomes a maximum of the temperature characteristics of the threshold current is provided. The line connecting point a1 indicating Ith(Tl) and point a2 indicating Ith(Th) of the curve A showing such temperature characteristics is the temperature characteristics of the bias current Ib where the slope rb becomes a maximum.

That is, when the slope rb is a maximum, the slope rb can be expressed with mathematical formula (41).

$$rb \propto (Ith(Th)A - Ith(Tl)A)/\Delta T \quad (41)$$

(where Ith(Th)A: Ith(Th) on curve A of FIG. 17, Ith(Tl)A: Ith(Tl) on curve A of FIG. 17).

A case in which the slope rb becomes a minimum will now be considered.

Figure 17:
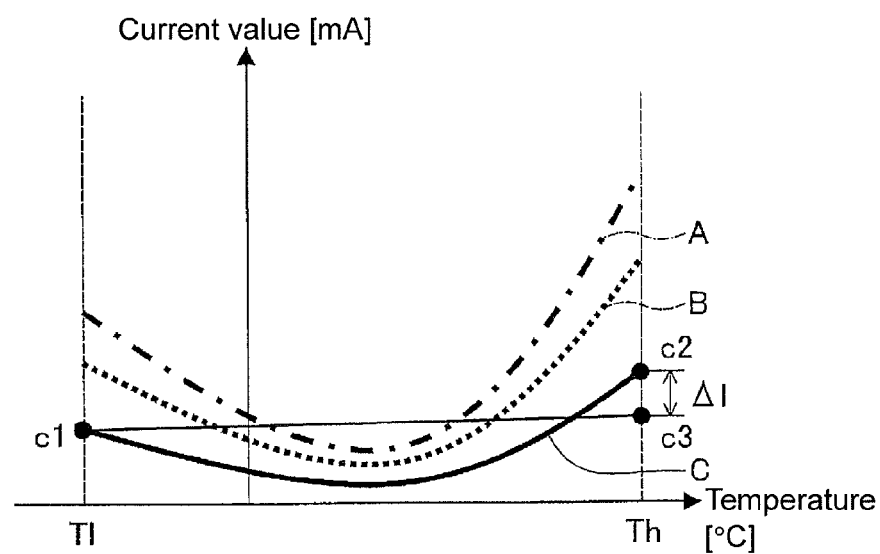
FIG. 17 is a diagram showing temperature characteristics of a bias current where the slope becomes a minimum when the temperature characteristics of the threshold current shown in FIG. 1 vary.
Figure 18:
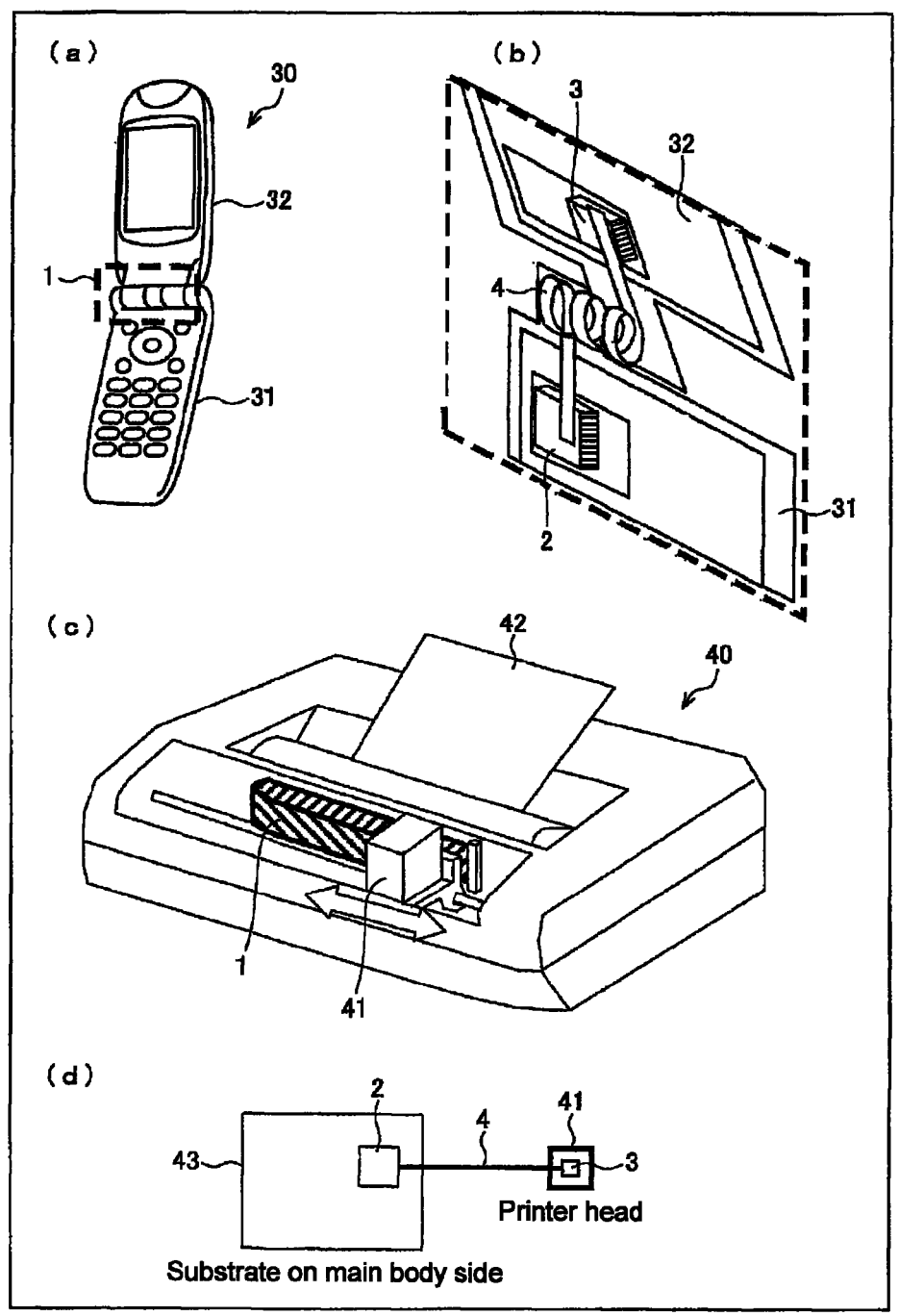
FIGS. 18(*a*) to 18(*d*) are a schematic view of a portable telephone that performs data communication with an optical wiring module, a perspective view of an internal circuit of the portable telephone that performs data communication with the optical wiring module, a schematic view of a printer that performs data communication with the optical wiring module, and a perspective view of an internal circuit of the printer that performs data communication with the optical wiring module, respectively.

FIG. 17 is a view showing the temperature characteristics of the bias current Ib when the slope rb becomes a minimum in a case in which the temperature characteristics of the threshold current shown in FIG. 1 vary.

The case in which the slope rb becomes a minimum is a case in which the temperature characteristics where the sth becomes a minimum of the temperature characteristics of the threshold current is provided. The line connecting point c1 indicating Ith(Tl) and point c2 indicating Ith(Th) of the curve C showing such temperature characteristics may obviously be the temperature characteristics of the bias current Ib.

In this case, however, slight oscillation delay may be ignored and the bias current may be smaller than the threshold current. That is, the power consumption can be further reduced by setting the minimum current value of the bias current at which the drawback of the data communication caused by the oscillation delay does not occur at Th.

The oscillation delay time TD in the case where the bias current Ib is smaller than the threshold current Ith can be expressed with the following mathematical formula (3).

$$T_D = \int_{N_o}^{N_{th}} \frac{dN}{(J/dq - N/\tau_s(N))} \quad (3)$$

Since the oscillation delay time TD is a known constant determined by the request from the system, the stationary carrier density N0 at the time of bias and the threshold carrier density Nth can be obtained from the mathematical formula (3).

The current drop degree ΔI when the oscillation delay occurred by TD can be obtained from the following mathematical formulas (4) and (5).

$$N_{th}/\tau_s(N_{th}) = J_{th}/dq \quad (4)$$

$$N_0/\tau_s(N_0) = J_0/dq \quad (5)$$

(where, N0: stationary carrier density at time of bias, Nth: threshold carrier density, J: current density at time of drive, N: carrier density, τs: carrier re-coupling time, τs(N): re-coupling time at carrier density N, τs(Nth): carrier re-coupling time at threshold, Jth: threshold current density, J0: current density at time of bias).

In other words, the threshold current density J0 is obtained from the threshold carrier density Nth obtained in the mathematical formula (3) and the mathematical formula (4). The current density J0 at the time of bias can be obtained from the stationary carrier density N0 at the time of bias obtained in mathematical formula (3) and the mathematical formula (5).

The bias current can be expressed by the product of the bias current density J0 and the active layer area, but the bias current can be obtained from the bias current density J0 since the active layer area is known. Similarly, the threshold current can be expressed by the product of the threshold current density Jth and the active layer area, but the threshold current can be obtained from the threshold current density Jth since the active layer area is known.

The difference between the bias current and the threshold current obtained through the above method is ΔI.

That is, if the current value of the bias current at Th is greater than or equal to Ith(Th)−ΔI, drawbacks in the data communication caused by the oscillation delay do not occur even when the bias current Ib becomes smaller than the threshold current Ith(Th) at Th.

Assume that the line connecting point c1 and point c3 at which Ib=Ith(Th)−ΔI at Th is the temperature characteristics of the bias current Ib where the slope rb becomes a minimum. The power consumption can be further reduced without causing drawbacks in the data communication arising from the oscillation delay.

That is, when the slope rb is a minimum, the slope rb can be expressed with mathematical formula (42).

$$rb \propto [(Ith(Th)C - \Delta I) - Ith(Tl)C]/\Delta T \quad (42)$$

(where Ith(Th)C: Ith(Th) on curve C of FIG. 17, Ith(Tl)C: Ith(Tl) on curve C of FIG. 17).

The method of setting the temperature characteristics of the bias current in view of the variation of the temperature characteristics of the threshold current in the embodiment shown in FIG. 1 has been described, but the setting of the tolerable range of the slope rb can be expressed using the mathematical formulas rb∝(Ith(Th)A−Ith(Tl)A)/ΔT and rb∝[(Ith(Th)C−ΔI)−Ith(Tl)C)] even in the embodiment shown in FIG. 6.

Ninth Embodiment

Figure 19:
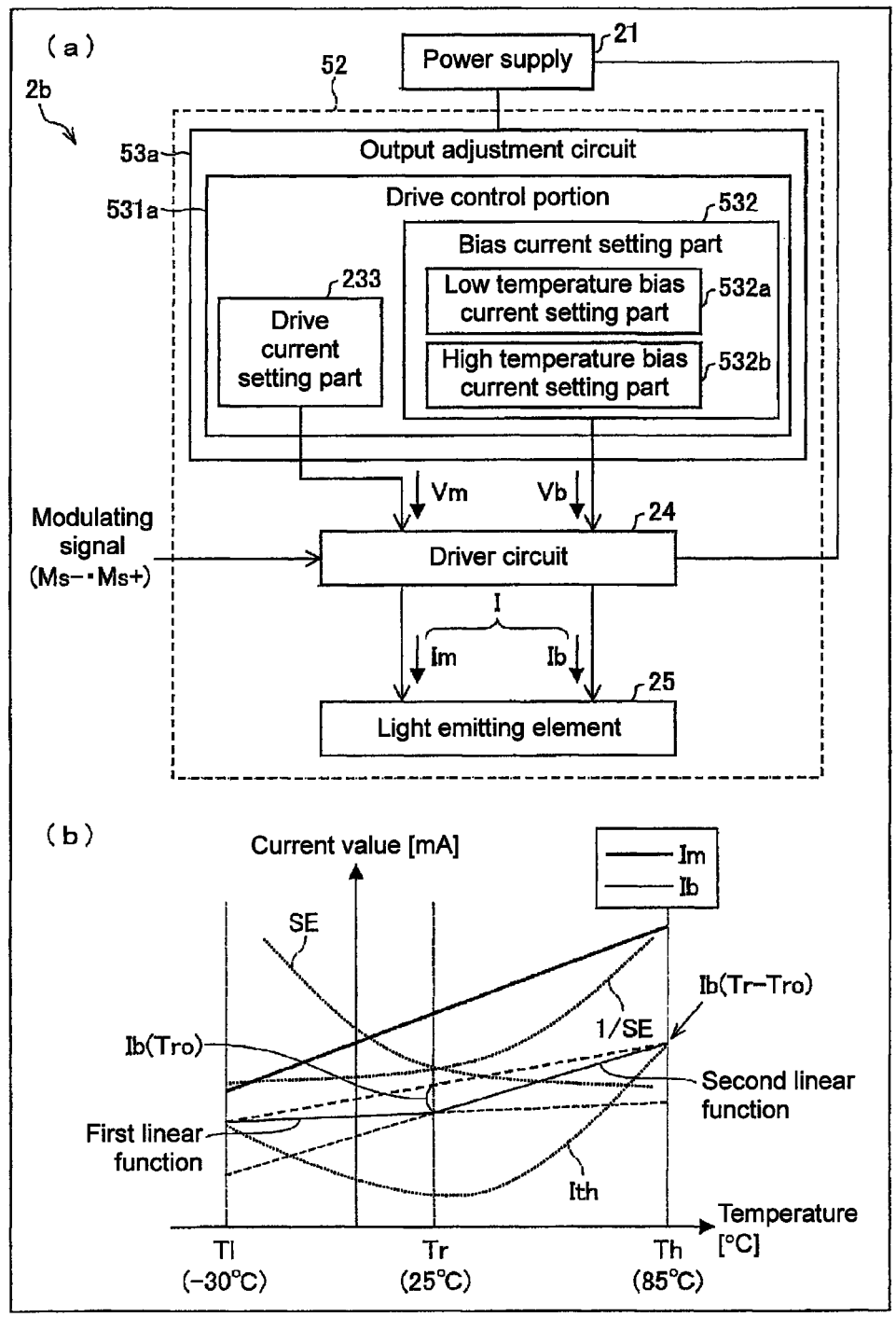
FIGS. 19(*a*) and 19(*b*) are a block diagram showing another circuit configuration of the light transmission device including the semiconductor laser drive method according to the present invention, and a graph showing yet another embodiment of the present invention and showing the semiconductor laser drive method according to the present invention, respectively.

The semiconductor laser drive method according to the present embodiment will now be described with reference to FIGS. 19 and 20.

In the above-described embodiments, the semiconductor laser drive method according to the present embodiment has been described assuming the temperature characteristics of the bias current are a linear function. However, the temperature characteristics of the bias current are not limited to the linear function, as described above.

In other words, the purpose of having the temperature characteristics of the bias current as a linear function in the above-described embodiment is to avoid the use of a circuit (APC circuit, ATC circuit etc.) that becomes a factor in increase of the power consumption, the cost, and the scale of the entire device. Thus, the temperature characteristics of the bias current may be a function other than the linear function if the configuration does not use such circuits.

Such a configuration may be the configuration shown in FIG. 19(a).

FIG. 19(a) is a view showing a circuit configuration of the light transmission device including the semiconductor laser drive method according to the present embodiment.

The light transmission device 2b shown in FIG. 19(a) is configured to include the power supply 21 and a light transmission device main body 52. The light transmission device main body 52 is configured to include an output adjustment circuit 53a, the driver circuit 24, and the light emitting element 25.

The semiconductor laser drive device according to the present invention is configured to include the output adjustment circuit 53a and the driver circuit 24.

The output adjustment circuit 53a is driven by the power supply 21, and changes the current values of the bias current and the drive current to be outputted by the driver circuit 24 according to the change in the drive temperature of the light transmission device 2b itself (drive temperature). The output adjustment circuit 53a includes a drive control portion 531a with a bias current setting part 532 including a low temperature bias current setting part 532a and a high temperature bias current setting part 532b, and the drive current setting part 233.

The operation principle of the drive current setting part 233 of the drive control portion 531a may be the same as the output adjustment circuit 23.

The bias current setting part 532 of the drive control portion 531a generates a signal Vb indicating the temperature characteristics of the desired bias current, and has an operation principle same as the bias current setting part 232 with regards to outputting the signal Vb to the driver circuit 24.

The bias current setting part 532 differs from the bias current setting part 232 in switching the temperature characteristics according to the drive temperature by the low temperature bias current setting part 532a and the high temperature bias current setting part 532b in which the temperature characteristics of the bias current differ from each other.

In other words, the low temperature bias current setting part 532a and the high temperature bias current setting part 532b set the bias current based on the temperature characteristics different from each other. The bias current setting part 532 sets the current value of the bias current by the low temperature bias current setting part 532a when the drive temperature is lower than predetermined temperature, and sets the current value of the bias current by the high temperature bias current setting part 532b when the drive temperature is higher than or equal to the predetermined temperature.

In both the low temperature bias current setting part 532a and the high temperature bias current setting part 532b, the temperature characteristics of the bias current with respect to the drive temperature are a linear function, and the linear function (hereinafter referred to as the "first linear function") indicating the temperature characteristics of the low temperature bias current setting part 532a and the linear function (hereinafter referred to as the "second linear function") indicating the temperature characteristics of the high temperature bias current setting part 532b have different slopes from each other. If the first linear function and the second linear function have different slopes from each other, one of the two linear functions may have a slope of zero, that is, it may be a constant current.

The configuration for switching the low temperature bias current setting part 532a and the high temperature bias current setting part 532 according to the drive temperature includes the following configuration.

A transistor (not shown) is arranged at the pre-stage of the low temperature bias current setting part 532a and the high temperature bias current setting part 532b in the bias current setting part 532b. The low temperature bias current setting part 532a and the high temperature bias current setting part 532b are switched by switching conduction/non-conduction of the transistor according to the control voltage corresponding to the drive temperature inputted thereto.

The low temperature bias current setting part 532a and the high temperature bias current setting part 532b can be configured by a simple circuit using a resistor, and the like, and the characteristics can be set by appropriately changing the set value of the resistor.

A method of setting the current values of the low temperature bias current setting part 532a and the high temperature bias current setting part 532b will now be described. In the present embodiment, the switching of the temperature characteristics of the bias current by the low temperature bias current setting part 532a and the high temperature bias current setting part 532b is performed at the normal temperature Tr, but the temperature of performing the switching is obviously not limited thereto.

In the present embodiment, an example of setting the current values of the low temperature bias current setting part 532a and the high temperature bias current setting part 532b to lower the bias current at Tr by a predetermined value Ib(Tro) in the embodiment shown in FIG. 1 will be described.

In this case, the first linear function is set to values satisfying mathematical formula (43)

$$Ib(T)=rb \cdot (T-Tr)+[Ib(Tr)-Ib(Tro)] \quad (43)$$

and the slope rb, which is the slope of the bias current Ib(T), is set to the following mathematical formula (44)

$$rb=[(Ith(Tr)-Ith(Tro))-Ith(Tl)]/\Delta T \quad (44)$$

In this case, the second linear function is set to values satisfying mathematical formula (45)

$$rb=[(Ith(Tr)-(Ith(Tro))-Ith(Tl)]/\Delta T \quad (44)$$

and the slope rb, which is the slope of the bias current Ib(T), is set to the following mathematical formula (46)

$$rb=[Ith(Tr)-(Ith(Tr)-Ith(Tro))]/\Delta T \quad (46).$$

The temperature characteristics of the bias current set by the first linear function and the second linear function obtained from the above conditions are shown in FIG. 19(b). As shown in FIG. 19(b), the temperature characteristics Ib(Tr–Tro) of the bias current Ib in the present embodiment have a broken line temperature characteristics in which the slope changes at the normal temperature.

As shown in FIG. 19(b), the temperature characteristics Ib(Tr–Tro) of the bias current Ib in the present embodiment have low bias current at the vicinity of the normal temperature Tr and the ambient temperature thereof, compared to the temperature characteristics Ib(T) of the bias current in which the temperature characteristics are linear over the entire range of the drive temperature range shown in FIG. 1.

Therefore, lower cost, space saving, and lower power of the semiconductor laser can be realized, and satisfactory transmission characteristics and light output can be obtained on the reception side over the entire drive temperature range in the drive of the semiconductor laser.

Furthermore, the power consumption originating from the bias current can be reduced, and very stable transmission characteristics and light output can be obtained on the reception side by driving the semiconductor laser with the characteristics including a plurality of linear functions for the temperature characteristics of the bias current.

In the present embodiment, the characteristics including two types of linear functions are provided for the temperature characteristics of the bias current, but this is not the sole case, and the temperature characteristics of the bias current may have the characteristics including three or more types of linear functions.

For example, when driving the semiconductor laser with the characteristics including three types of linear functions for the temperature characteristics of the bias current, a normal temperature bias current setting part is further arranged in the bias current setting part in addition to the low temperature bias current setting part and the high temperature bias current setting part. The predetermined temperature for switching such parts includes two points (first predetermined temperature and second predetermined temperature, where first predetermined temperature<second predetermined temperature). The bias current setting part sets the current value of the bias current by the low temperature bias current setting part when the drive temperature is lower than the first predetermined temperature, sets the current value of the bias current by the normal temperature bias current setting part when the drive temperature is higher than or equal to the first predetermined temperature and lower than or equal to the second predetermined temperature, and sets the current value of the bias current by the high temperature bias current setting part when the drive temperature is higher than or equal to the second predetermined temperature.

In the present embodiment, the bias current value obtained by the first linear function is equal to the bias current value obtained by the second linear function at the drive temperature (i.e., normal temperature Tr in the present embodiment) for switching the first linear function and the second linear function, but this is not the sole case. In other words, the bias current value obtained by the first linear function and the bias current value obtained by the second linear function may have different values from each other at the drive temperature (i.e., predetermined temperature) for switching the first linear function and the second linear function.

In the present embodiment, an example of switching the temperature characteristics of the bias current in the first linear function and the second linear function in the embodiment shown in FIG. 1 has been described, but this is not the sole case. In other words, the switching of the temperature characteristics of the bias current may be applied to other embodiments described above.

Furthermore, in the present embodiment, the low temperature bias current setting part 532a and the high temperature bias current setting part 532b are arranged in the bias current setting part 532, and only the temperature characteristics of the bias current are represented with a linear function of a plurality of types corresponding to the drive temperature, but is not limited thereto. In other words, in the semiconductor laser drive method according to the present embodiment, a drive current setting part 533 including a low temperature drive current setting part 533a and a high temperature drive current setting part 533b in which the temperature characteristics of the drive current are linear functions different from each other (detailed description on low temperature drive current setting part 533a, high temperature drive current setting part 533b, and drive current setting part 533 will be described later) may be arranged in place of the drive current setting part 233, and such parts may be switched according to the drive temperature to represent the temperature characteristics of the drive current with the linear function of a plurality of types. In this case, the low temperature drive current setting part 533a and the high temperature drive current setting part 533b may be configured with a simple circuit using a resistor and the like, and the characteristics may be set by appropriately changing the set value of the resistor.

According to the above configuration, the semiconductor laser drive method capable of reducing the power consumption originating from the drive current can be realized.

Figure 20:
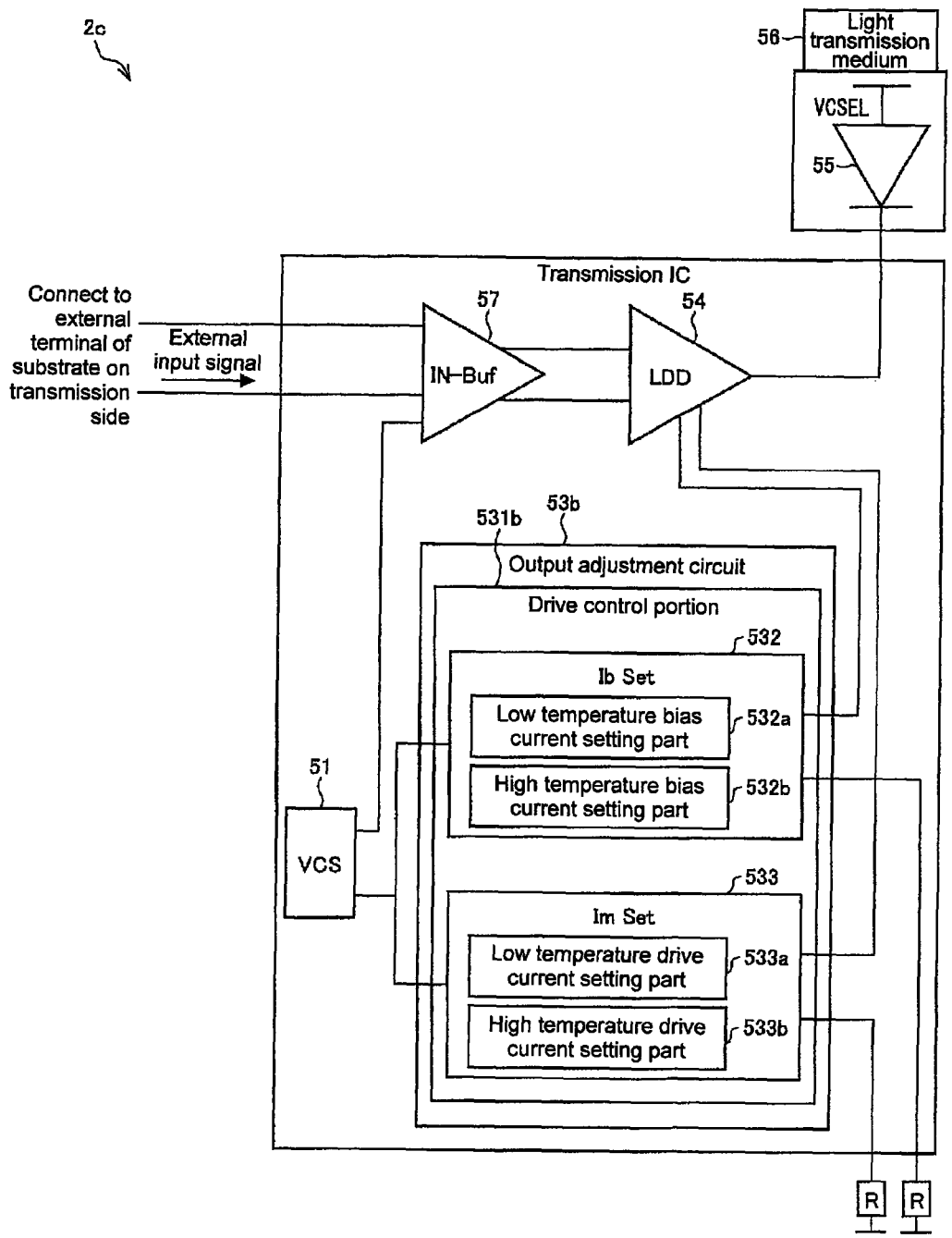
FIG. 20 is a block diagram showing a circuit configuration when implementing the light transmission device as the surface emitting semiconductor laser drive circuit and the surface emitting semiconductor laser.
Figure 21:
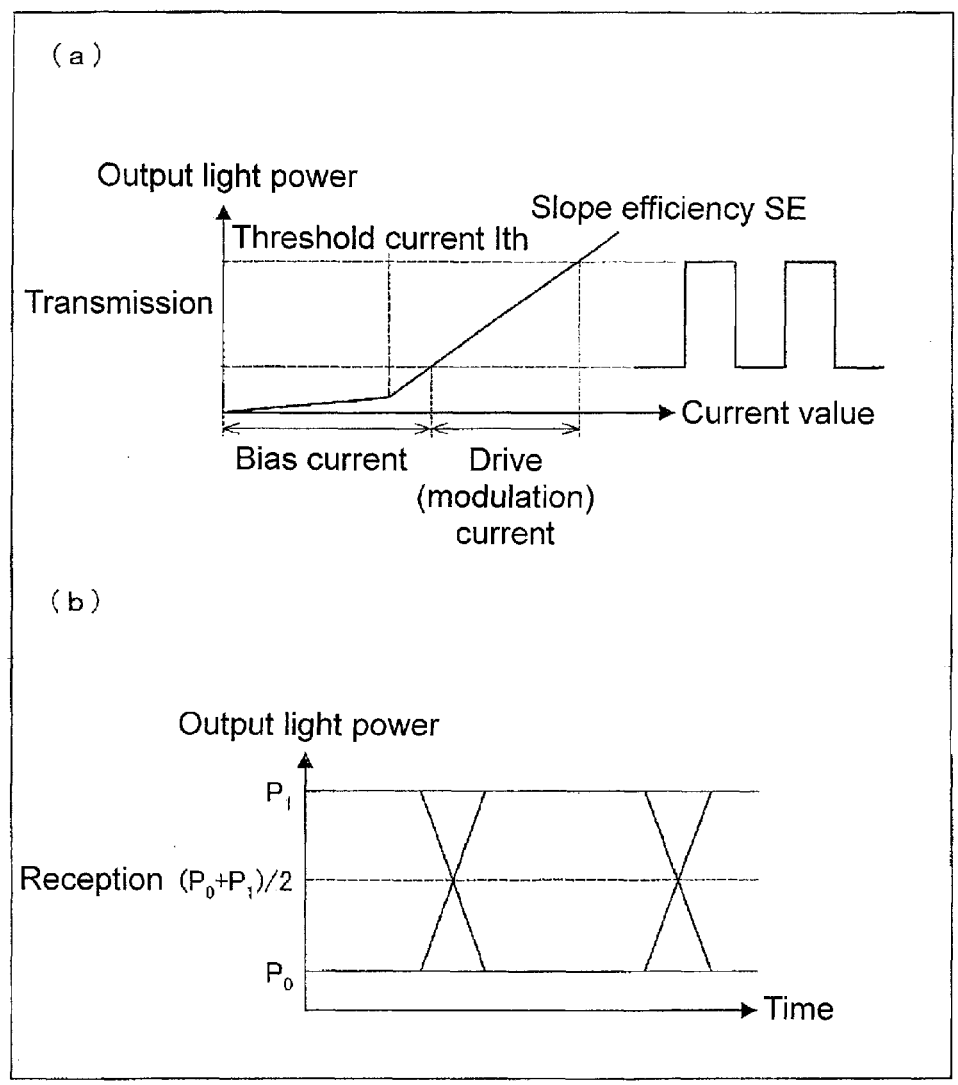
FIGS. 21(*a*) and 21(*b*) are a view showing a relationship between power of output light of a surface emitting semiconductor laser on a transmission side and a current value, and a view showing transmission characteristics of the surface emitting semiconductor laser on a reception side, respectively.

When implementing the light transmission device 2b having the above configuration with the surface emitting semiconductor laser drive circuit and the surface emitting semiconductor laser, the circuit configuration thereof will be that of the light transmission device 2c shown in FIG. 20.

The light transmission device 2c shown in FIG. 20 has a configuration including a power supply (VCS) 51, an output adjustment circuit 53b provided with a drive control portion 531b with a bias current setting part (Ib Set) 532 and a drive current setting part (Im Set) 533, a driver circuit (LDD) 54, a surface emitting semiconductor laser 55, and an amplifier circuit (IN-Buf) 57. The power supply 51, the output adjustment circuit 53b, the driver circuit 54, and the amplifier circuit 57 are arranged on the same substrate (transmission IC). The surface emitting semiconductor laser 55 is arranged on a substrate (VCSEL) different from the transmission IC, and is connected to the exterior (e.g., light reception device 3) through the light transmission medium (e.g., light guide 4).

The power supply 51 is a voltage source for driving the amplifier circuit 57 and the output adjustment circuit 53b by supplying the voltage Vcc to the amplifier circuit 57 and the output adjustment circuit 53b.

The amplifier circuit 57 has the input end connected to an external terminal of a substrate (not shown) on the transmission side in a plurality of substrates for performing data communication connected to the light transmission device 2c, and the output end connected to the driver circuit 54. The amplifier circuit 57 is driven by the power supply 51, amplifies the external input signal (binary electric signal of "1" and "0") from the substrate on the transmission side, and applies the same to the driver circuit 54 as modulating signal Ms− (modulating signal indicating signal of "0") and Ms+(modulating signal indicating signal of "1").

The output adjustment circuit 53b has the input end connected to the power supply 51, one end of the output ends connected to the driver circuit 54 and the other end connected to the "R". The output adjustment circuit 53b is driven by the power supply 51, and changes the current values of the bias current and the drive current outputted by the driver circuit 54 according to change in the drive temperature of the light transmission device 2c itself.

The output adjustment circuit 53b includes the bias current setting part 532 with the low temperature bias current setting part 532a and the high temperature bias current setting part 532b, and the drive current setting part 533 with the low temperature drive current setting part 533a and the high temperature drive current setting part 533b in the drive control portion 531b. The bias current setting part 532 and the drive current setting part 533 control the bias current and the drive current in the following manner.

The bias current setting part 532 switches the temperature characteristics according to the drive temperature with the low temperature bias current setting part 532a and the high temperature bias current setting part 532b, in which the temperature characteristics of the bias current are linear functions different from each other. In other words, the low temperature bias current setting part 532a and the high temperature bias current setting part 532b set the bias current based on the temperature characteristics that become linear functions different from each other. The bias current setting part 532 sets the current value of the bias current by the low temperature bias current setting part 532a when the drive temperature is lower than predetermined temperature, and sets the current value of the bias current by the high temperature bias current setting part 532b when the drive temperature is higher than or equal to the predetermined temperature.

The drive current setting part 533 switches the temperature characteristics according to the drive temperature with the low temperature drive current setting part 533a and the high temperature drive current setting part 533b, in which the temperature characteristics of the drive current are linear functions different from each other. In other words, the low temperature drive current setting part 533a and the high temperature drive current setting part 533b set the drive current based on the temperature characteristics that become linear functions different from each other. The drive current setting part 533 sets the current value of the drive current by the low temperature drive current setting part 533a when the drive temperature is lower than a predetermined temperature, and sets the current value of the drive current by the high temperature drive current setting part 533b when the drive temperature is higher than or equal to the predetermined temperature.

When the control voltage corresponding to the drive temperature is applied to the bias current setting part 532 (low temperature bias current setting part 532a and high temperature bias current setting part 532b), the bias current setting part 532 generates a signal Vb indicating the temperature characteristics of the desired bias current based on the control voltage, and outputs the signal Vb to the driver circuit 54. Similarly for the drive current setting part 533 (low temperature drive current setting part 533a and high temperature drive current setting part 533b), the drive current setting part 533 applied with the control voltage generates a signal Vm indicating the temperature characteristics of the desired bias current based on the control voltage, and outputs the signal Vm to the driver circuit 54.

The driver circuit 54 has one input end connected to the amplifier circuit 57, the other input end connected to the output adjustment circuit 53b, and the output end connected to the surface emitting semiconductor laser 55. The driver circuit 54 outputs the bias current and the drive current to the surface emitting semiconductor laser 55. The driver circuit 54 receives the output signals Vb and Vm, and the modulating signals Ms− and Ms+. The driver circuit 54 generates the bias current Ib based on the output signal Vb, and generates the drive current Im based on the output signal Vm. The direct modulation is performed by switching the bias current Ib and the drive current Im with the modulating signals Ms− and Ms+ to generate the binary signals of "1" and "0", and the binary signals are outputted to the surface emitting semiconductor laser 55.

The surface emitting semiconductor laser 55 outputs an optical signal by emitting light according to the binary signal from the driver circuit 54, and transmits the optical signal to the outside through the light transmission medium 56.

Tenth Embodiment

One example of a device that performs data communication with an optical wiring module including the surface emitting semiconductor laser driven through the drive method described in the above-described embodiments as a light source is shown in FIGS. 18(a) to 18(d). The configuration of the optical wiring module may be the configuration same as the optical wiring module 1 shown in FIG. 2.

FIG. 18(a) is a schematic view of a portable telephone that performs data communication with the optical wiring module. FIG. 18(b) is a perspective view of an internal circuit of the portable telephone that performs data communication with the optical wiring module.

A portable telephone 30 shown in FIG. 18(a) has a signal processing circuit substrate 31, and a liquid crystal driver circuit substrate 32 including a display unit 33 connected with the optical wiring module 1. Specifically, as shown in FIG. 18(b), the light transmission device 2 and the signal processing circuit substrate 31 are connected, the light reception device 3 and the liquid crystal driver circuit substrate 32 are connected, and the light transmission device 2 and the light reception device 3 are connected by the light guide 4 having high bendability.

The data communication thus can be carried out between the signal processing circuit substrate 31 and the liquid crystal driver circuit substrate 32 in the portable telephone 30. In other words, the information stored on the signal processing circuit substrate 31 side can be displayed on the display unit 33 arranged on the liquid crystal driver circuit substrate 32 side.

FIG. 18(c) is a schematic view of a printer that performs data communication with the optical wiring module 1. FIG. 18(d) is a perspective view of an internal circuit of the printer that performs data communication with the optical wiring module 1.

A printer 40 shown in FIG. 18(c) has a printer head 41 and a substrate 43 on a printer main body side connected with the optical wiring module 1. Specifically, as shown in FIG. 18(d), the light transmission device 2 and the substrate 43 on the printer main body side are connected, the light reception device 3 and the printer head 41 are connected, and the light transmission device 2 and the light reception device 3 are connected by the light guide 4 having high bendability.

Therefore, the data communication can be carried out between the printer head 41 and the substrate 43 on the printer main body side in the printer 40. In other words, the information related to characters and images stored on the substrate 43 side on the printer main body side is transmitted to the printer head 41 in FIG. 18(c). The printer head 41 that received the information reads out the characters and images from the information. The printer head 41 then can print out the characters and images on a paper 42.

The present invention is not limited to the above-described embodiments, and various modifications may be made within the scope of the Claims, where the embodiments obtained by appropriately combining the technical means disclosed in different embodiments are also encompassed in the technical scope of the present invention.

INDUSTRIAL APPLICABILITY

The semiconductor laser drive device and the semiconductor laser drive method of the present invention enable lower cost, space spacing, and lower power, and obtain satisfactory transmission characteristics and light output on the reception side over the entire drive temperature range, and thus can be utilized in driving the surface emitting semiconductor laser. Use can also be made in the optical wiring module using the surface emitting semiconductor laser as a light source, as well as, the optical communication network enabling large capacity data communication at high speed such as optical communication, optical network, and optical interconnection that uses such optical wiring module.

The invention claimed is:

1. A semiconductor laser drive device comprising:
   drive means for outputting an optical signal from a semiconductor laser by applying a bias current, or the bias current and a drive current, to the semiconductor laser based on a modulating signal; and
   output adjustment means for controlling a value of the bias current and a value of the drive current to apply to the drive means;
   wherein the output adjustment means comprises:
      bias current setting means for setting the bias current value, based on the drive temperature of the semiconductor laser, so that temperature characteristics of the bias current value with respect to a drive temperature are a function having a slope other than zero,
      wherein the bias current setting means sets the bias current value so that the temperature characteristics of the bias current value are a function including at least a first linear function that linearly changes from a lower limit temperature within a drive temperature range to a predetermined temperature within the drive temperature range, and a second linear function that linearly changes from the predetermined temperature to an upper limit temperature within the drive temperature range and that has a slope different from the first linear function, and
      drive current setting means for setting the drive current value, based on the drive temperature, so that temperature characteristics of the drive current value with respect to a drive temperature are a function having a slope other than zero; and
   wherein the temperature characteristics of the bias current value and the temperature characteristics of the drive current value are functions different from each other.

2. The semiconductor laser drive device according to claim 1, wherein the bias current setting means of the output adjustment means sets the bias current value so that the temperature characteristics of the bias current value are a linear function having a slope other than zero.

3. The semiconductor laser drive device according to claim 1, wherein the semiconductor laser has the temperature characteristics of a threshold current value with respect to own drive temperature of a curve projecting downward in a graph in which a vertical axis is the threshold current value and a horizontal axis is the drive temperature.

4. The semiconductor laser drive device according to claim 1, wherein the drive current setting means of the output adjustment means sets the drive current value so that the temperature characteristics of the drive current value are a linear function having a slope other than zero.

5. The semiconductor laser drive device according to claim 1, wherein the bias current setting means of the output adjustment means sets the temperature characteristics Ib(T) of the bias current value to Ib(T)=rb·(T−Tr)+Ib(Tr)
   (where T: drive temperature, Tr: normal temperature, Ib(Tr): bias current at normal temperature Tr), and sets slope rb of temperature characteristics of bias current value to rb=[Ith(Th)−Ith(Tl)±γ]/ΔT
   (where Ith(Th): threshold current value of semiconductor laser at upper limit temperature Th within drive temperature range, Ith(Tl): threshold current value of semiconductor laser at lower limit temperature Tl within drive temperature range, ΔT: drive temperature range, that is, upper limit Th within drive temperature range—lower limit temperature Tl within drive temperature range, γ: predetermined bias current value, or set to Ith(Th)−Ith(Tl)±γ≠0).

6. The semiconductor laser drive device according to claim 1, wherein the drive current setting means of the output adjustment means has the temperature characteristics of the drive current value as a function substantially inversely proportional to a slope efficiency serving as a slope of fluctuation in power of output light from the semiconductor laser with respect to fluctuation in a current value when the current value of the semiconductor laser is raised from the bias current to the drive current, or an approximate line in which the function is approximated.

7. The semiconductor laser drive device according to claim 1,
wherein the semiconductor laser outputs the optical signal with respect to a light reception device including a light receiving element for receiving the optical signal; and
the drive current setting means of the output adjustment means has the temperature characteristics of the drive current value as a function substantially inversely proportional with respect to a light receiving quantity in the light receiving element when the current value of the semiconductor laser is raised from the bias current to the drive current, or an approximate line in which the function is approximated.

8. The semiconductor laser drive device according to claim 1, wherein
the semiconductor laser outputs the optical signal as a binary signal including "1" and "0" with respect to a light reception device including a light receiving element for receiving the optical signal and a reception side integrated circuit for amplifying the optical signal received by the light receiving element; and
the output adjustment means sets the bias current value and the drive current value in a case where the drive temperature is a normal temperature to values satisfying:
a first condition in which a extinction ratio, which is a ratio of the power of the output light when outputting the signal of "1" and the power of the output light when outputting the signal of "0", at the drive temperature the power of the output light from the semiconductor laser becomes a minimum within the drive temperature range is a value greater than or equal to a predetermined value,
a second condition in which the bias current value is greater than or equal to a threshold current value of the semiconductor laser in a predetermined region within the drive temperature range, and
a third condition in which the light receiving quantity of the optical signal at the light receiving element of the light reception device is greater than or equal to a minimum light receiving sensitivity serving as minimum power of an incident light that can be received of the reception side integrated circuit of the light reception device over an entire range within the drive temperature range.

9. The semiconductor laser drive device according to claim 8, wherein
the bias current setting means and the drive current setting means of the output adjustment means determine a bias current value Ib(Tw) and a drive current value Im(Tw) at a drive temperature Tw where the power of the output light from the semiconductor laser becomes a minimum within the drive temperature range that satisfies the first condition by $$[Ib(Tw)+Im(Tw)-Ith(Tw)]/[Ib(Tw)-Ith(Tl)] \geq E$$

(where Ith(Tw): threshold current value of semiconductor laser at Tw, E: minimum value of extinction ratio in which output light can be received by light reception device),
determine the bias current value Ib(Tw) and the drive current value Im(Tw) at the drive temperature Tw where the power of the output light from the semiconductor laser becomes a minimum within the drive temperature range that satisfies the third condition by $$Im(Tr) \geq -Ib(Tr)+(r2-r1)\cdot(Tw-Tr)+Ith(Tw)+(Pmin/\alpha\eta)$$

(where r2: slope of temperature characteristics of drive current value, r1: slope of temperature characteristics of bias current value, Pmin: minimum light receiving sensitivity, α: light loss in path between semiconductor laser and light receiving element of light reception device, η slope efficiency), and set the bias current value and the drive current value in the case where the drive temperature is the normal temperature to values further satisfying a fourth condition in which the upper limit of the bias current value and the upper limit of the drive current value defined by the characteristics of the transmission side integrated circuit incorporating the semiconductor laser are determined.

10. The semiconductor laser drive device according to claim 8, wherein the output adjustment means controls the bias current value and the drive current value so that the drive temperature where the power of the output light from the semiconductor laser becomes a minimum within the drive temperature range matches the lower limit temperature or the upper limit temperature in the drive temperature range.

11. The semiconductor laser drive device according to claim 1, wherein the bias current setting means of the output adjustment means matches the bias current value with the threshold current value of the semiconductor laser at the lower limit temperature and the upper limit temperature in the drive temperature range.

12. The semiconductor laser drive device according to claim 8, wherein the bias current setting means and the drive current setting means of the output adjustment means match the bias current value with the threshold current value of the semiconductor laser at the lower limit temperature and the upper limit temperature in the drive temperature range, and set the bias current value and the drive current value at the normal temperature to values satisfying relationships of:

$$Im(Tr)=-Ib(Tr)+(r2-r1)\cdot(Tw-Tr)+Ith(Tw)+(Pmin/\alpha\eta)$$
and $$Im(Tr)=Im(Tw)-r2(Tw-Tr).$$

13. The semiconductor laser drive device according to claim 8, wherein the bias current setting means and the drive current setting means of the output adjustment means set the bias current value and the drive current value when the drive temperature is the normal temperature to values further satisfying the fourth condition in which the extinction ratio Er (Er<E) at the normal temperature is a value greater than or equal to a predetermined value.

14. The semiconductor laser drive device according to claim 8, wherein the bias current setting means and the drive current setting means of the output adjustment means set the bias current value and the drive current value when the drive temperature is the normal temperature to values further satisfying the fourth condition in which a fluctuation range of the power of the output light is a value smaller than or equal to a predetermined value over the entire range of the drive temperature range.

15. The semiconductor laser drive device according to claim 1, wherein the temperature characteristics Ith(T) of the threshold current value of the semiconductor laser are expressed as mathematical formula (1):

$$Ith(T) = Ith(Tr)\exp\left[\left(\frac{T-Tr}{T_{01}}\right)^2 + \left(\frac{T-Tr}{T_{02}}\right)\right] \qquad (1)$$

(where, Ith(Tr): threshold current value of semiconductor laser at normal temperature; $T_{01}$: characteristic temperature defining fluctuation range of gain spectrum of semiconductor laser with respect to drive temperature; $T_{02}$: characteristic temperature defining reduction amount of maximum gain of semiconductor laser with respect to drive temperature).

16. The semiconductor laser drive device according to claim 1, wherein the temperature characteristics Ith(T) of the threshold current value of the semiconductor laser are expressed as mathematical formula (2):

$$Ith(T) = Ith(Tc)\exp\left[\left(\frac{T-Tc}{T_{01}}\right)^2 + \left(\frac{T-Tc}{T_{02}}\right)\right] \quad (2)$$

(where, Ith(Tc): threshold current value of semiconductor laser at temperature Tc; $T_{01}$:
characteristic temperature defining fluctuation range of gain spectrum of semiconductor laser with respect to drive temperature; $T_{02}$: characteristic temperature defining reduction amount of maximum gain of semiconductor laser with respect to drive temperature, or Tc≦lower limit temperature T1 within drive temperature range or upper limit temperature Th within drive temperature range≦Tc).

17. The semiconductor laser drive device according to claim 5, wherein a tolerable range of the slope rb of the temperature characteristics of the bias current value with respect to variation in the temperature characteristics of the threshold current value with respect to the drive temperature of the semiconductor laser is:

[Ith(Th)A−Ith(Tl)A]/ΔT≧rb≧[Ith(Th)C−Ith(Tl)C/ΔT]−α

(where, Ith(Th)A: Ith(Th) in temperature characteristics of threshold current value of semiconductor laser in which value of Ith(Th)−Ith(Tl) is largest, Ith(Tl)A: Ith(Th) in temperature characteristics of threshold current value of semiconductor laser in which value of Ith(Th)−Ith(Tl) is largest, Ith(Th)C:Ith(Th) in temperature characteristics of threshold current value of semiconductor laser in which value of Ith(Th)−Ith(Tl) is smallest, Ith(Tl)C:Ith(Th) in temperature characteristics of threshold current value of semiconductor laser in which value of Ith(Th)−Ith(Tl) is smallest, or set to [Ith(Th)C−Ith(Tl)C/ΔT]−α≠0.

18. A semiconductor laser drive method comprising:
a driving step of outputting an optical signal from a semiconductor laser by applying a bias current, or the bias current and a drive current, to the semiconductor laser based on a modulating signal; and
an output adjustment step of controlling a value of the bias current and a value of the drive current to apply in the driving step;
wherein, in the driving step,
the bias current value is set, based on the drive temperature of the semiconductor laser, so that temperature characteristics of the bias current value with respect to a drive temperature are a function having a slope other than zero,
the bias current is set so that the temperature characteristics of the bias current value are a function including at least a first linear function that linearly changes from a lower limit temperature within a drive temperature range to a predetermined temperature within the drive temperature range, and a second linear function that linearly changes from the predetermined temperature to an upper limit temperature within the drive temperature range and that has a slope different from the first linear function, and
the drive current value is set, based on the drive temperature, so that a temperature characteristics of the drive current value with respect to the drive temperature are a function having a slope other than zero; and
the temperature characteristics of the bias current value and the temperature characteristics of the drive current value are functions different from each other.

19. A light transmission device comprising:
a semiconductor laser drive device according to claim 1; and
a semiconductor laser, in which temperature characteristics of a threshold current value with respect to own drive temperature are a curve projecting downward in a graph in which a vertical axis is the threshold current value and a horizontal axis is the drive temperature, for outputting an optical signal when inputted with the bias current and the drive current inputted from the semiconductor laser drive device.

20. The light transmission device according to claim 19, wherein
output adjustment means of the semiconductor laser drive device includes two or more types of temperature characteristics of the bias current value; and
the temperature characteristics of the bias current value are varied according to variation in the temperature characteristics of the threshold current value of the semiconductor laser.

21. A light transmission device comprising:
a semiconductor laser drive device according to claim 7; and
a semiconductor laser, in which temperature characteristics of a threshold current value with respect to own drive temperature are a curve projecting downward in a graph in which a vertical axis is the threshold current value and a horizontal axis is the drive temperature, for outputting an optical signal when inputted with the bias current and the drive current inputted from the semiconductor laser drive device.

22. The light transmission device according to claim 21, wherein
the output adjustment means of the semiconductor laser drive device includes two or more types of temperature characteristics of the bias current value; and
the temperature characteristics of the bias current value are varied according to variation in the temperature characteristics of the threshold current value of the semiconductor laser.

23. An optical wiring module comprising:
a light transmission device according to claim 19;
a light reception device for receiving the optical signal outputted by the light transmission device; and
a transmission medium for performing data communication between the light transmission device and the light reception device by connecting the light transmission device and the light reception device.

24. An optical wiring module comprising:
a light transmission device according to claim 21;
a light reception device, including a light receiving element for receiving an optical signal and a reception side integrated circuit for amplifying the optical signal received by the light receiving element, for receiving the optical signal as a binary signal including "1" and "0"; and
a transmission medium for performing data communication between the light transmission device and the light reception device by connecting the light transmission device and the light reception device; wherein
the light reception device receives the optical signal outputted by the light transmission device through the transmission medium.

25. An electronic device for performing data communication with the optical wiring module according to claim 23.

* * * * *